United States Patent
Kyoh et al.

(10) Patent No.: US 7,029,799 B2
(45) Date of Patent: Apr. 18, 2006

(54) EXPOSURE METHOD FOR FORMING PATTERN FOR IC CHIPS ON RETICLE BY USE OF MASTER MASKS

(75) Inventors: Suigen Kyoh, Kawasaki (JP); Soichi Inoue, Yokohama (JP)

(73) Assignees: Kabushiki Kaisha Toshiba, Tokyo (JP); Dai Nippon Printing Co., Ltd., Tokyo (JP)

( * ) Notice: Subject to any disclaimer, the term of this patent is extended or adjusted under 35 U.S.C. 154(b) by 216 days.

(21) Appl. No.: 10/118,050

(22) Filed: Apr. 9, 2002

(65) Prior Publication Data

US 2002/0160277 A1    Oct. 31, 2002

(30) Foreign Application Priority Data

Apr. 9, 2001    (JP)    ............................. 2001-110309

(51) Int. Cl.
G03F 1/00        (2006.01)
G03C 5/00        (2006.01)

(52) U.S. Cl. ............................ 430/5; 430/311; 430/312

(58) Field of Classification Search .................... 430/5, 430/312, 311

See application file for complete search history.

(56) References Cited

U.S. PATENT DOCUMENTS 5,567,575 A    10/1996    Hirama
5,705,299 A    1/1998    Tew et al.
6,136,517 A    10/2000    Fletcher
6,165,692 A    12/2000    Kanai et al.
6,340,542 B1 *    1/2002    Inoue et al. .................... 430/5

FOREIGN PATENT DOCUMENTS

| CN | 1275797 A | 12/2000 |
| EP | 1 043 625 A1 | 10/2000 |
| JP | 55-108738 | 8/1980 |
| JP | 58-173832 | 10/1983 |

OTHER PUBLICATIONS

S. Kyoh et al; "Management Of Pattern Generation System Based on I-Line Stepper" International Society for Optical Engineering—20th Annual BACUS Symposium On Photomask Technology, vol. 4186, 9 pages, (Sep. 20, 2000).

* cited by examiner

*Primary Examiner*—Geraldine Letscher
(74) *Attorney, Agent, or Firm*—Finnegan, Henderson, Farabow, Garrett & Dunner, L.L.P.

(57) ABSTRACT

There is provided a method which forms master masks used when a pattern of size larger than a region which can be exposed at one time is exposed on a to-be-exposed object. The pattern of the size larger than the region which can be exposed at one time is divided into a region of low repetitiveness and a region of high repetitiveness. A pattern of the region of low repetitiveness is drawn on at least one first master mask. Further, a pattern of the region of high repetitiveness is drawn on at least one second master mask.

28 Claims, 16 Drawing Sheets

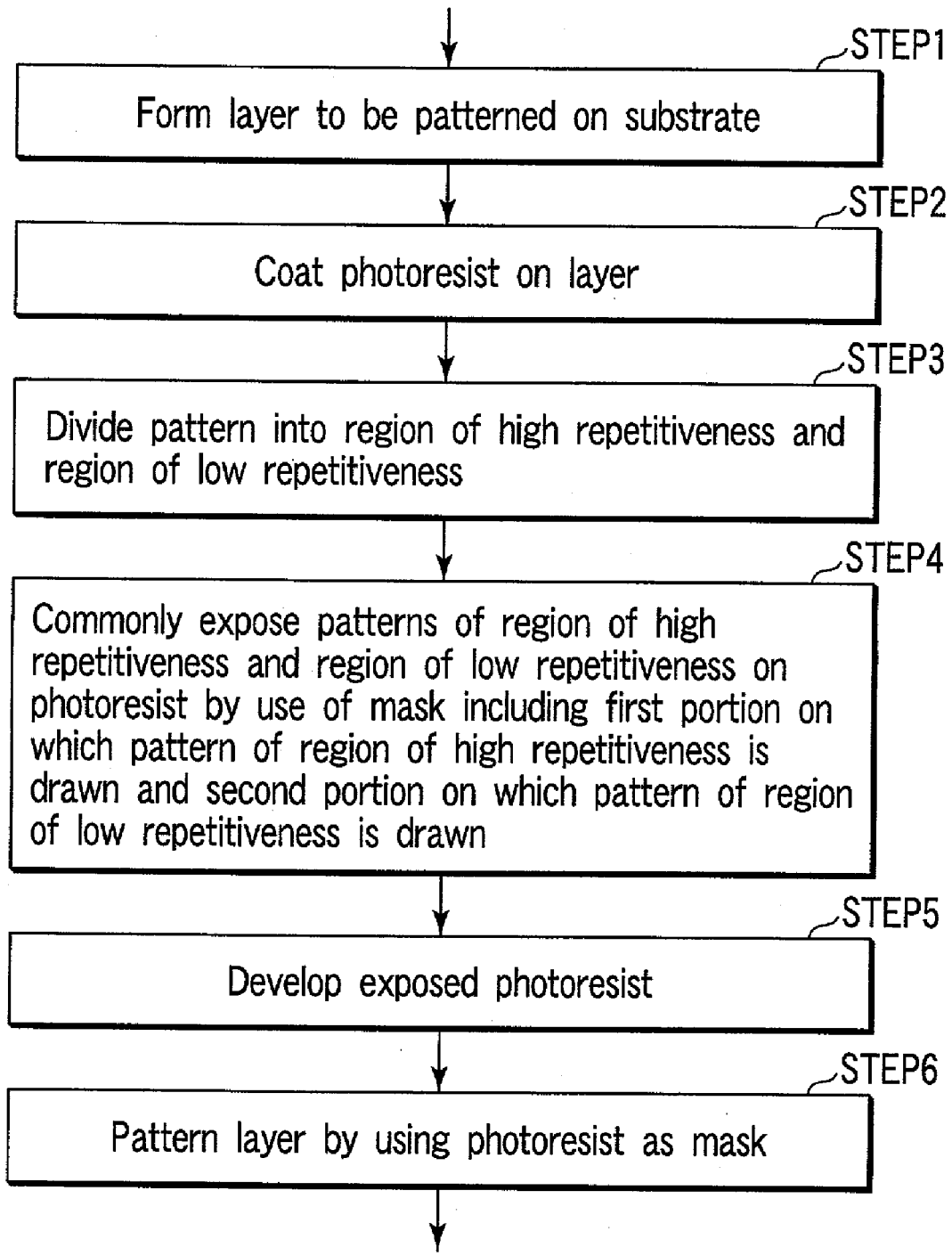
F I G. 16B

EXPOSURE METHOD FOR FORMING PATTERN FOR IC CHIPS ON RETICLE BY USE OF MASTER MASKS

CROSS-REFERENCE TO RELATED APPLICATIONS

This application is based upon and claims the benefit of priority from the prior Japanese Patent Application No. 2001-110309, filed Apr. 9, 2001, the entire contents of which are incorporated herein by reference.

BACKGROUND OF THE INVENTION

1. Field of the Invention

This invention relates to a master mask, a method which forms the master masks, an exposure method using the master masks, and a semiconductor device manufacturing method using the exposure method. More particularly, this invention relates to master masks used when a pattern of size larger than a region which can be exposed at one time is exposed on a to-be-exposed object, for example, when a reticle is formed, a method which forms the master masks, an exposure method which forms an IC chip pattern on a reticle by an exposure/transfer device by use of the master masks, a semiconductor device manufacturing method which forms a etching mask or a photoresist pattern by use of a reticle formed by the exposure method, and a semiconductor device manufacturing method using a photoresist patterned by the exposure method as a mask.

2. Description of the Related Art

The conventional exposure method which forms a pattern on a reticle by use of an exposure/transfer device is explained. As the exposure/transfer device, an i-line stepper is used. The i-line stepper reduces the pattern on the master mask to one fifth so as to transfer the reduced pattern onto the reticle with high precision. The size of a pattern which can be exposed at one time (which is hereinafter referred to as a shot) is a square form of 22 mm×22 mm on the reticle. Generally, a pattern on the reticle has the size of approximately 100 mm×100 mm. Therefore, when a desired pattern is formed on the reticle by use of the i-line stepper, it is necessary to couple a plurality of shots. There are two methods for coupling a plurality of shots.

The first method is to perform the exposure process while adjacent shots are simply put in contact with each other. The method is simple, but there occurs a possibility that the precision will be lowered in portions where shots are coupled.

The second method is to mount a special optical filter on the i-line stepper and perform the exposure process while portions of adjacent shots are arranged to overlap each other. In the present specification, the method is referred to as a "superposition exposure method" below. By use of the superposition exposure method, shots can be coupled with such high precision as to neglect coupled portions. The substantial size of the shot is 21 mm×21 mm when the above method is used.

One example of a pattern to be formed on the reticle is shown in FIG. 1A. All of the dimensions indicated in the present specification are expressed as the dimensions on the reticle. As shown in FIG. 1A, the repetition interval at which functional elements A, that is, IC chip patterns are arranged is 33 mm in the X direction and 30 mm in the Y direction. Then, 3×4=12 functional elements A in total are arranged on a reticle 101.

The functional elements A arranged on the reticle 101 is surrounded by a dicing region 102 with the width of 0.5 mm on the upper and lower sides and right and left sides and the whole size of a pattern to be formed on the reticle is 99.5 mm×120.5 mm. Like the functional element A, in the dicing region 102, a fine pattern is formed. The fine pattern is used as a quality control mark when a pattern drawn on the reticle 101 is exposed on the wafer and is different from that of the functional element A. All of the patterns formed in the functional elements A are the same patterns and have repetitiveness, but the above patterns do not basically have the repetitiveness. Therefore, if the pattern shown in FIG. 1A is formed on the reticle 101 by use of the i-line stepper, it becomes necessary to use master masks of a number to cover the entire region.

That is, in the pattern shown in FIG. 1A, the number of master masks in the X direction is five since 99.5 mm/21 mm=4.7 and the number of master masks in the Y direction is six since 120.5 mm/21 mm=5.7.

Therefore, as shown in FIG. 1B, it is necessary to use 5×6=30 master masks 103 (103-1 to 103-30).

Thus, in the conventional method which forms master masks used to draw a pattern larger than the shot on the reticle 101, the number of master masks 103 cannot be reduced even if the functional elements A having the repetitiveness are present in the pattern since the pattern of the dicing region 102 has no repetitiveness. The cost for forming the master masks directly gives influence on the price of a reticle to be formed by use of the master masks, that is, the manufacturing cost thereof. Therefore, in order to lower the cost of the reticle and the cost of a semiconductor product having a circuit pattern formed by use of the reticle, it is necessary to reduce the number of master masks.

BRIEF SUMMARY OF THE INVENTION

According to an aspect of the present invention, there is provided a method which forms master masks used when a pattern of size larger than a region which can be exposed at one time is exposed on a to-be-exposed object, comprising dividing the pattern of the size larger than the region which can be exposed at one time into a region of low repetitiveness and a region of high repetitiveness, drawing a pattern of the region of low repetitiveness on at least one first master mask, and drawing a pattern of the region of high repetitiveness on at least one second master mask.

According to another aspect of the present invention, there is provided a method which forms master masks used when a pattern of size larger than a region which can be exposed at one time is exposed on a to-be-exposed object, comprising dividing the pattern of the size larger than the region which can be exposed at one time into a region of low repetitiveness and a region of high repetitiveness, drawing a pattern of the region of high repetitiveness on at least one master mask, and drawing a pattern of the region of low repetitiveness on a portion of the master mask other than a portion of the master mask on which the pattern of the region of high repetitiveness is drawn.

According to still another aspect of the present invention, there is provided an exposure method used to expose a pattern of size larger than a region which can be exposed at one time on a to-be-exposed object by using master masks on which the pattern divided into patterns lying within a range of the region which can be exposed at one time is drawn, comprising dividing the pattern of the size larger than the region which can be exposed at one time into a region of low repetitiveness and a region of high repetitiveness, exposing a pattern of the region of low repetitiveness on the to-be-exposed object by use of at least one first master mask on which the pattern of the region of low repetitiveness is drawn, and commonly exposing a pattern of the region of high repetitiveness on the to-be-exposed object by use of at least one second master mask on which the pattern of the region of high repetitiveness is drawn.

According to still another aspect of the present invention, there is provided an exposure method used to expose a pattern of size larger than a region which can be exposed at one time on a to-be-exposed object by using master masks on which the pattern divided into patterns lying within a range of the region which can be exposed at one time is drawn, comprising dividing the pattern of the size larger than the region which can be exposed at one time into a region of low repetitiveness and a region of high repetitiveness, and exposing a pattern of the region of low repetitiveness on the to-be-exposed object by use of a master mask having a first portion on which a pattern of the region of high repetitiveness is drawn and a second portion on which the pattern of the region of low repetitiveness is drawn and commonly exposing the pattern of the region of high repetitiveness on the to-be-exposed object by use of the master mask.

According to still another aspect of the present invention, there is provided a master mask correcting method used to form master masks by correcting master masks on which one pattern divided into a plurality of patterns is drawn, comprising drawing a pattern obtained by correcting to-be-corrected portions of the above one pattern on one master mask when the to-be-corrected portions of the above one pattern lie over a plurality of master masks.

BRIEF DESCRIPTION OF THE SEVERAL VIEWS OF THE DRAWING

FIG. 16B is a process flowchart for illustrating a modification of the manufacturing method shown in FIG. 16A.

DETAILED DESCRIPTION OF THE INVENTION

Figure 1A:
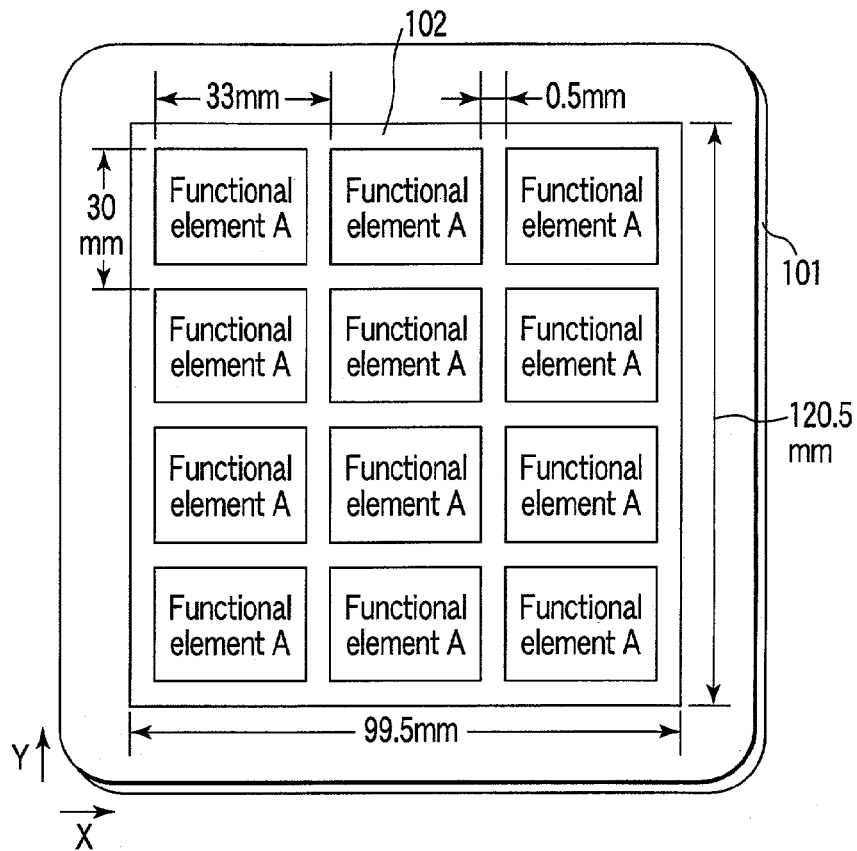
FIG. 1A is a plan view of a reticle.
Figure 1B:
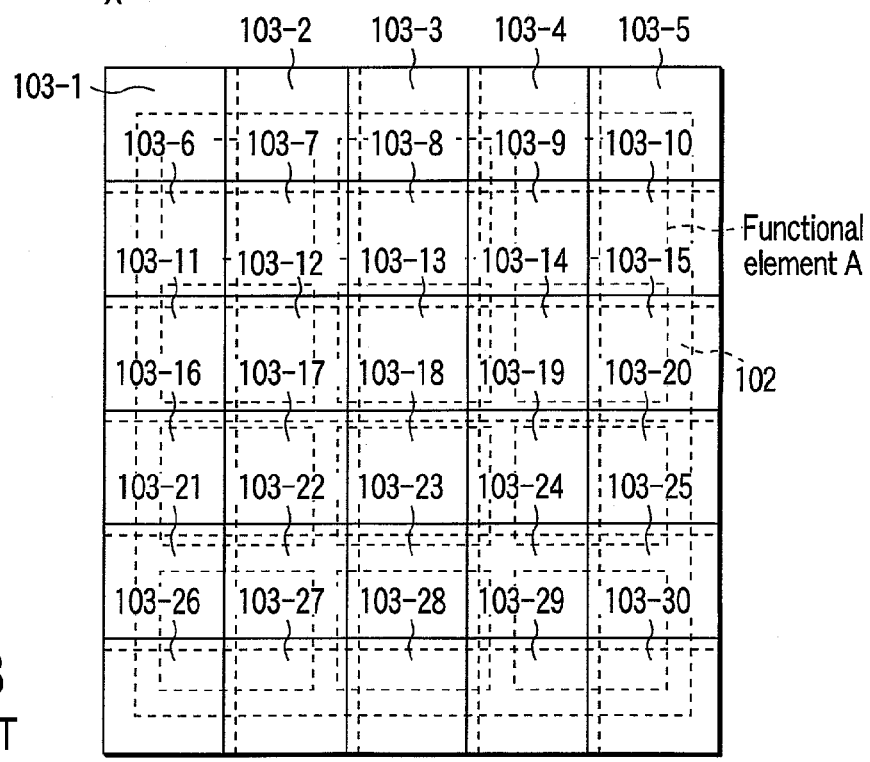
FIG. 1B is a plan view showing an example of the arrangement of the conventional master masks used to form the reticle shown in FIG. 1A.
Figure 2:
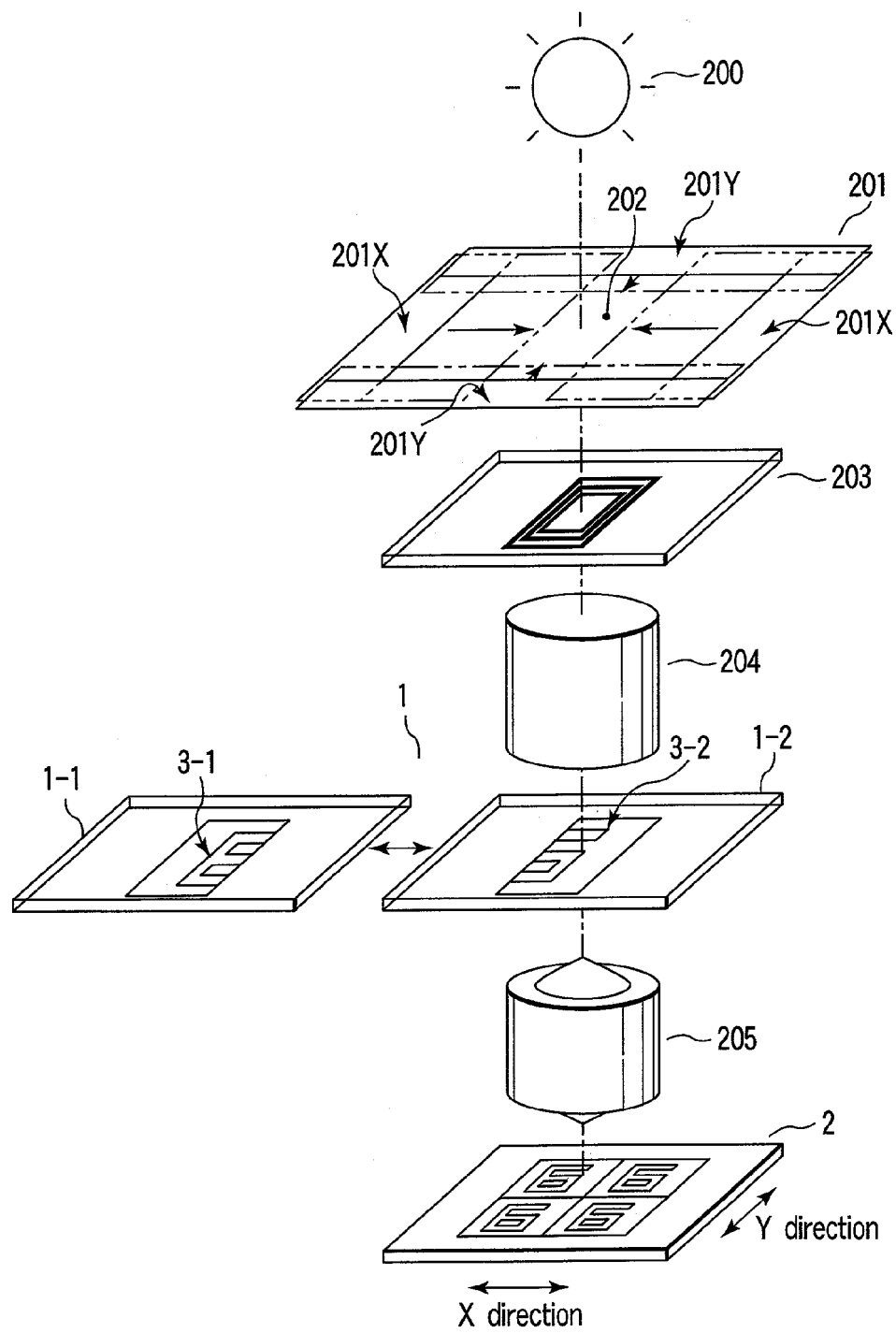
FIG. 2 is a perspective view showing the schematic structure of an exposure device used in the present invention.

Before explaining the embodiments of this invention, first, the schematic structure of an exposure device used in this invention is explained. FIG. 2 is a perspective view showing the schematic structure of the exposure device used in the present invention.

As shown in FIG. 2, light emitted from a light source 200 is made incident on a mechanical blind (movable blind) 201.

The mechanical blind 201 shields light emitted from the light source 200 to limit an exposure field (shot) of a master mask 1. For example, the mechanical blind 201 includes an X-blind 201X movable in an X direction and a Y-blind 201Y movable in a Y direction. The exposure field is adequately limited by variously changing the size of a window 202 through which light is transmitted by use of the X-blind 201X and Y-blind 201Y. Light limited by the mechanical blind 201 is made incident on a gradation filter 203.

The gradation filter 203 is a filter which is used when the superposition exposure method is used and performs the control operation to linearly reduce the amount of exposure light in a portion in which exposure lights overlap. By linearly reducing the exposure light amount, the exposure light amount can be suppressed from becoming excessive or insufficient in a portion in which exposure lights overlap and shots can be coupled to each other with high precision. Light whose exposure light amount is controlled by use of the gradation filter 203 is applied to the master mask 1 via an illumination optical system 204 so as to illuminate the master mask 1.

The master mask 1 includes a plurality of master masks and divided portions of a pattern 3 which is desired to be transferred onto a daughter mask 2 are drawn onto the exposure fields thereof. In FIG. 2, two master masks 1-1, 1-2 are shown and a left half portion (3-1) and right half portion (3-2) of the pattern 3 which is desired to be transferred are respectively drawn on the two master masks. Light which illuminates the master mask 1 is made incident on a reduction projection optical system 205 via the master mask 1.

The reduction projection optical system 205 reduces a pattern 3 drawn on the master mask 1, for example, reduces the pattern to one fifth thereof and then projects the reduced pattern onto the daughter mask 2. For example, a photosensitive resin (photoresist) is coated on the surface of the daughter mask 2 and exposed according to the projected pattern. In FIG. 2, eight shots in total including four shots in the X direction and two shots in the Y direction are shown. The exposure process is performed for each shot, that is, it is performed eight times in total. For the exposure process, an exposure system such as a so-called step-and-repeat system in which the exposure process is sequentially performed while moving a stage on which the daughter mask 2 is mounted in the X and Y directions may be used. Thus, four patterns in total each including the patterns 3-1, 3-2 are transferred on the daughter mask 2.

Next, a master mask forming method which forms the master mask 1 according to the first embodiment of this invention is explained in detail.

FIRST EMBODIMENT

In order to reduce the number of master masks required for forming a reticle formed by use of the exposure device shown in FIG. 2, the following measure is taken in the first embodiment.

The basic configuration of the measure is to separately expose a semiconductor element, for example, a functional element A used as an IC chip and a dicing region.

Since exactly the same pattern of the functional element A repeatedly appears on the reticle 2, it is sufficient if master masks of a number corresponding to one functional element A are used. In the prior art, all of the functional elements A on the reticle 2 are formed on the master masks together with the dicing regions.

However, as will be described later, the number of patterns drawn on the master masks can be reduced by using the method according to the first embodiment. In addition, an increase in the number of master masks can be suppressed.

The reason why the functional element A and the dicing region can be separately exposed is that, first, the functional element A is an element which functions in a single form and is perfectly independent from the dicing region and, secondly, a pattern of several ten μm which is called a guard ring and does not require high precision exists on the boundary between the functional element A and the dicing region. That is, the functional element A and the dicing region are formed in contact with each other, but a pattern which requires high precision does not exist on the boundary therebetween. Therefore, sufficient precision can be attained simply by exposing shots while the shots are set in contact with each other instead of coupling the shots by use of the special filter as described before, for example, the gradation filter 203 shown in FIG. 2.

As described before, since a pattern such as a quality control mark which requires high precision exists in the dicing region, it is necessary to perform the exposure process by use of the gradation filter 203, for example, in order to couple the dicing regions in the above portions to each other. In this case, since a pattern which requires high precision does not exist in a portion in which the dicing regions intersect in a "cruciform" or "T-shaped form", a method which exposes shots while the shots are set in contact with each other in the above portions can be used.

The number of master masks specifically required when using the above measure is explained below.

Figure 3:
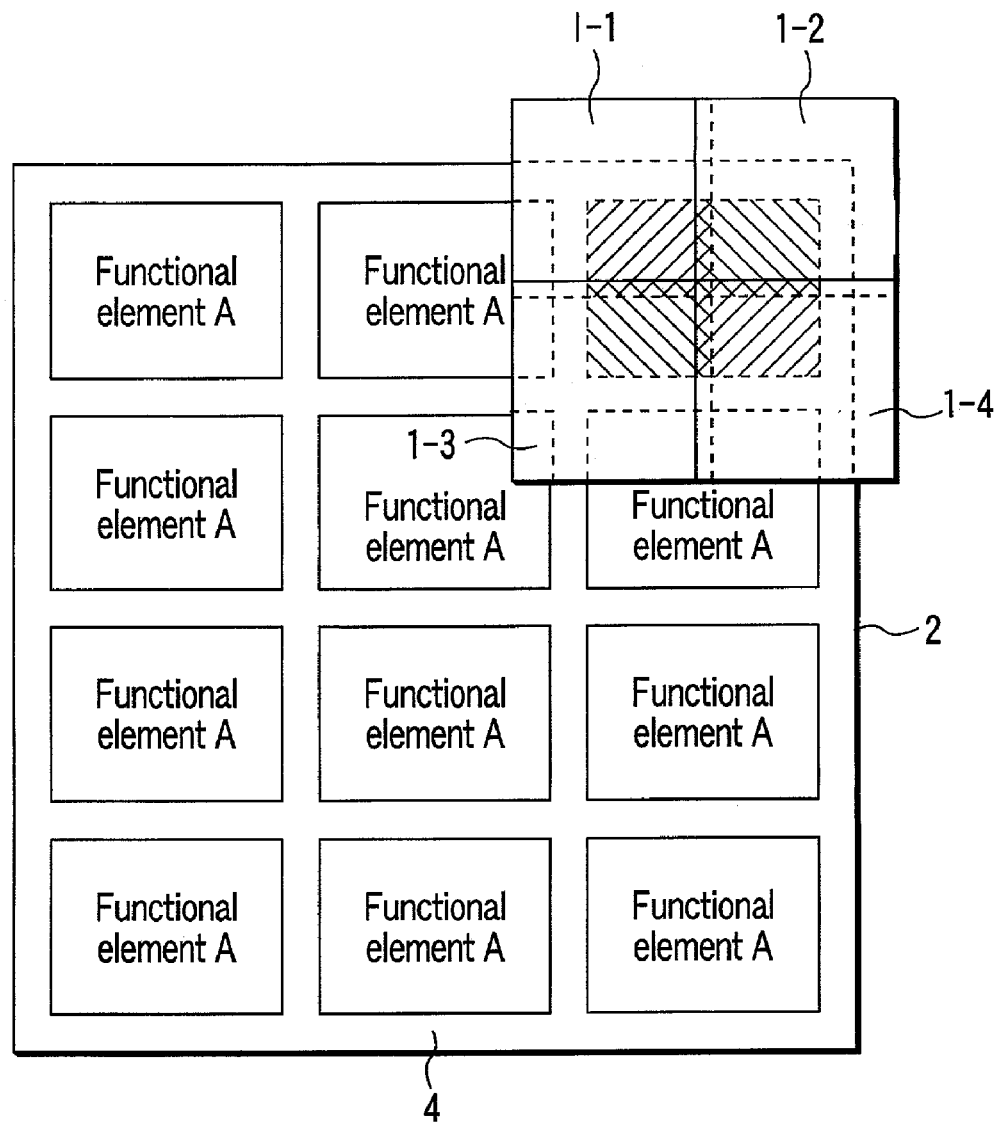
FIG. 3 is a plan view showing functional element forming master masks according to a first embodiment of this invention.

FIG. 3 is a plan view showing master masks required for forming the functional element A.

As shown in FIG. 3, the area of the functional element A is 32.5 mm×29.5 mm obtained by subtracting the dicing width from the repetition interval 33 mm×30 mm. Further, the pattern area which can be transferred when four master masks 1-1 to 1-4 are used is 42 mm×42 mm since each master mask is 21 mm×21 mm. Thus, when the pattern area of the four master masks and the area of the functional element A are compared with each other, it is understood that the pattern area of the four master masks is larger. Therefore, the number of master masks required for exposing the functional element A is four.

Figure 4A:
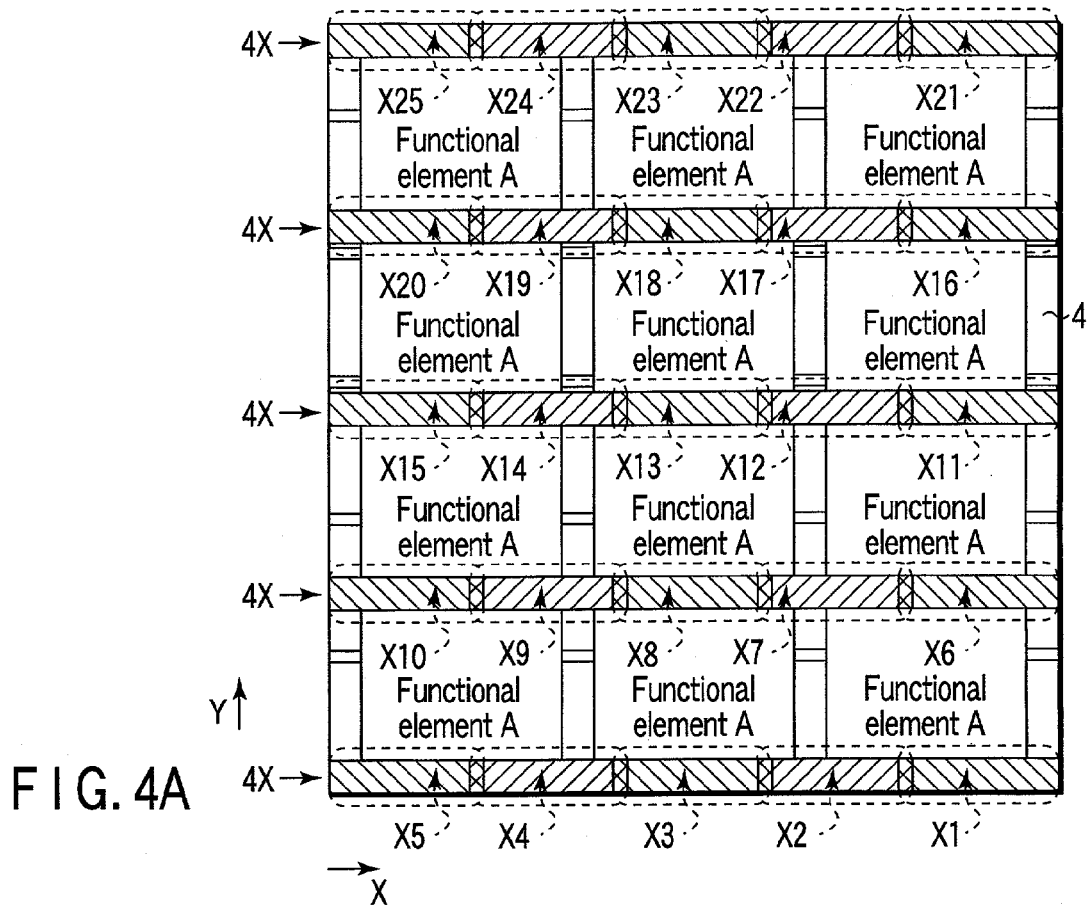
FIG. 4A is a plan view showing division of an X-direction dicing region.
Figure 4B:
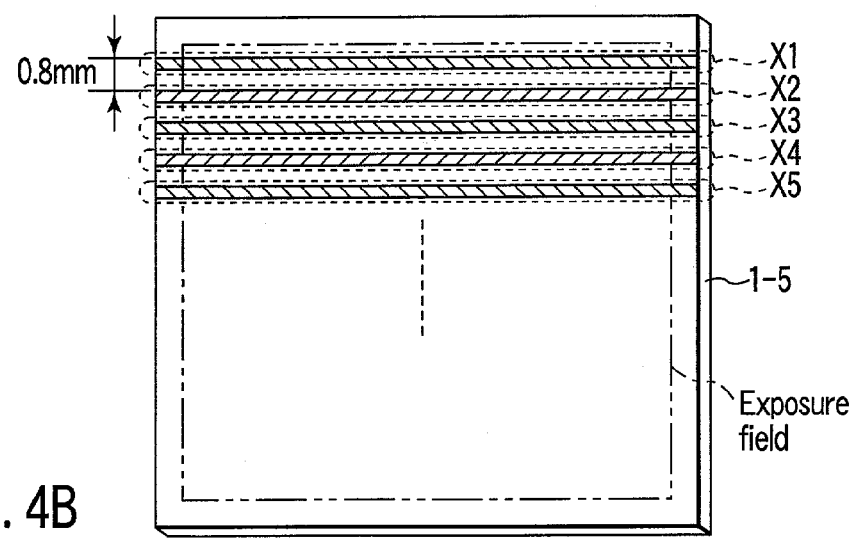
FIG. 4B is a plan view showing an X-direction dicing region forming master mask according to a first embodiment of this invention.
Figure 5A:
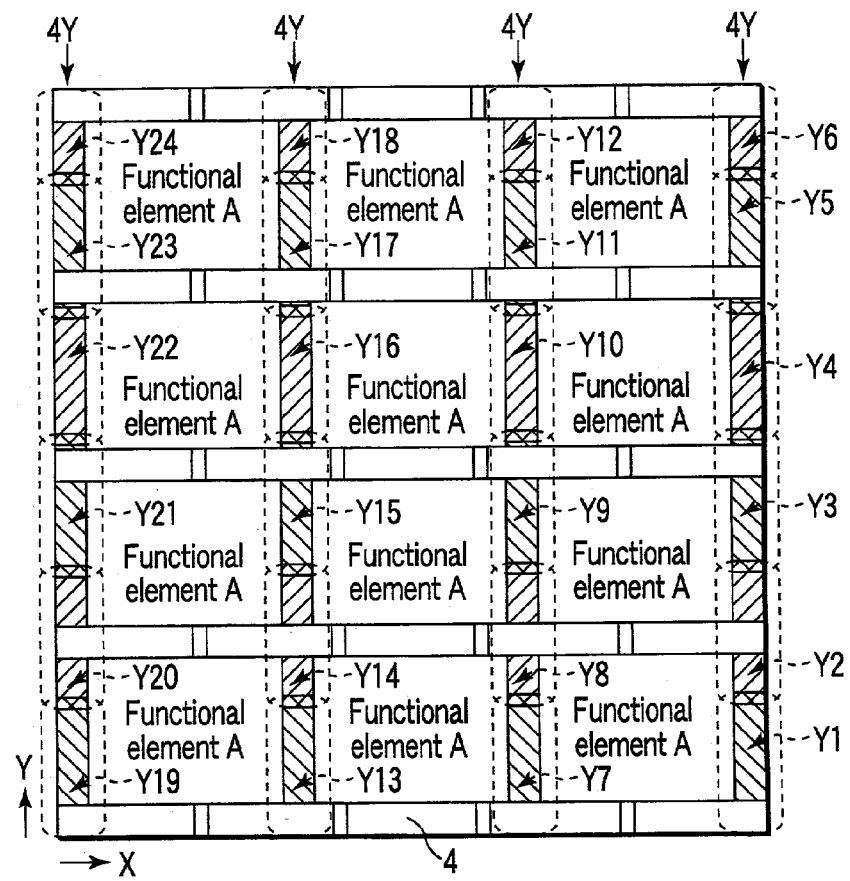
FIG. 5A is a plan view showing division of a Y-direction dicing region.
Figure 5B:
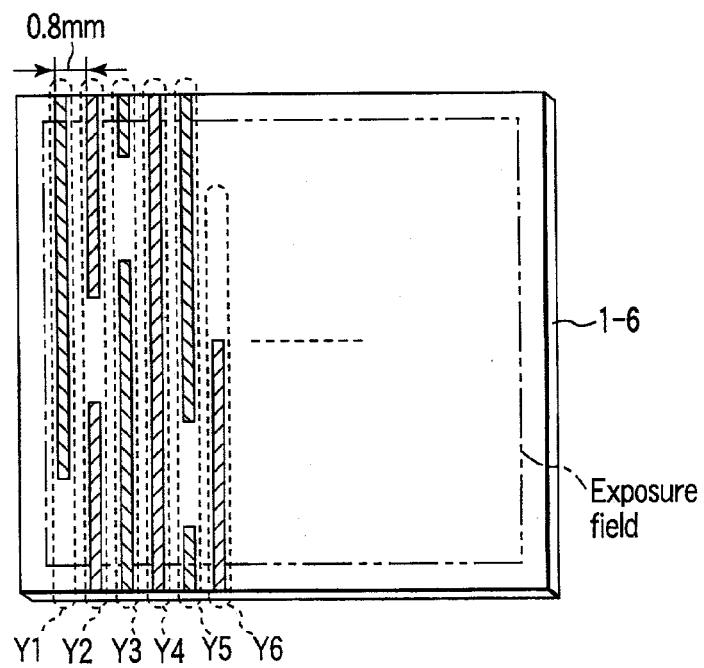
FIG. 5B is a plan view showing a Y-direction dicing region forming master mask according to a first embodiment of this invention.

FIGS. 4A and 4B are plan views showing master masks required for forming the dicing region, particularly, the dicing region in the X direction and FIGS. 5A and 5B are plan views showing master masks required for forming the dicing region in the Y direction.

As shown in FIGS. 4B and 5B, the number of master masks required for exposing a dicing region 4 is two. The reason for this is explained in detail below.

First, as shown in FIG. 4A, a dicing region 4X in the X direction is divided into regions X (X1 to X25) each of which can be exposed at one time, and as shown in FIG. 4B, the divided regions X are arranged at regular intervals on one master mask 1-5. Likewise, as shown in FIG. 5A, a dicing region 4Y in the Y direction is divided into regions Y (Y1 to Y24) each of which can be exposed at one time, and as shown in FIG. 5B, the divided regions Y are arranged at regular intervals on one master mask 1-6. In this specification, the divided region X or Y is referred to as a divided chip.

The dicing region 4X in the X direction requires five divided chips X and the dicing region 4Y in the Y direction requires six divided chips Y.

Further, since the dicing region 4X in the X direction is arranged on five lines and the dicing region 4Y in the Y direction is arranged on four lines, 5×5=25 divided chips X in the X direction are required and 6×4=24 divided chips Y in the Y direction are required. In FIG. 4B, a case wherein the divided chips X1 to X5 in the X direction in the lower end portion are arranged on the master mask 1-5 and the divided chips Y1 to Y6 in the Y direction in the right end portion are arranged on the master mask 1-6 is shown as an example.

In order to form the patterns of the dicing region 4 on a reticle, it is necessary to arrange all of the patterns of the dicing region 4 on the master mask 1. The dicing region 4 looks larger than a functional element A at a glance. However, in the first embodiment, the number of master masks required for exposing the dicing region 4 is two.

This is because the dicing region 4 is divided in the X and Y directions into the divided chips X (X1 to X25) and Y (Y1 to Y24) which can be exposed at one time and the respective divided chips are arranged on one master mask. Then, the exposure process is performed by selecting each of the divided chips X1 to X25 and selecting each of the divided chips Y1 to Y24. The selective exposure process may be attained by limiting the exposure field by use of the mechanical blind 201 of the exposure device shown in FIG. 2. The state in which the exposure field is limited is shown in FIGS. 6A and 6B.

Figure 6A:
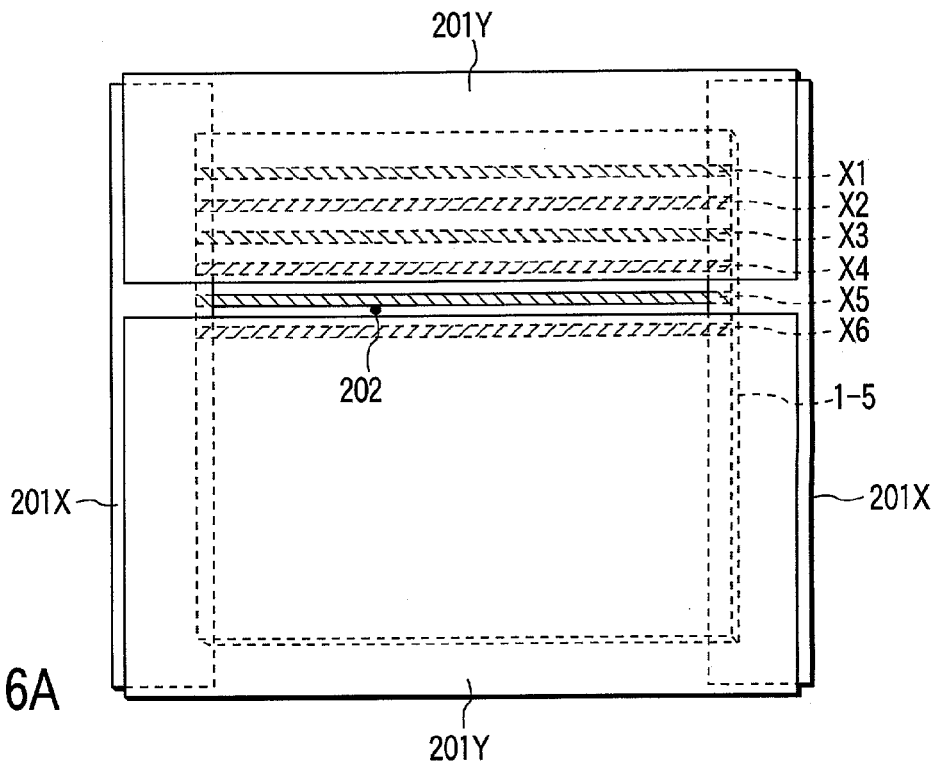
FIG. 6A is a plan view showing a state in which the X-direction dicing region forming master mask according to the first embodiment of this invention is illuminated.
Figure 6B:
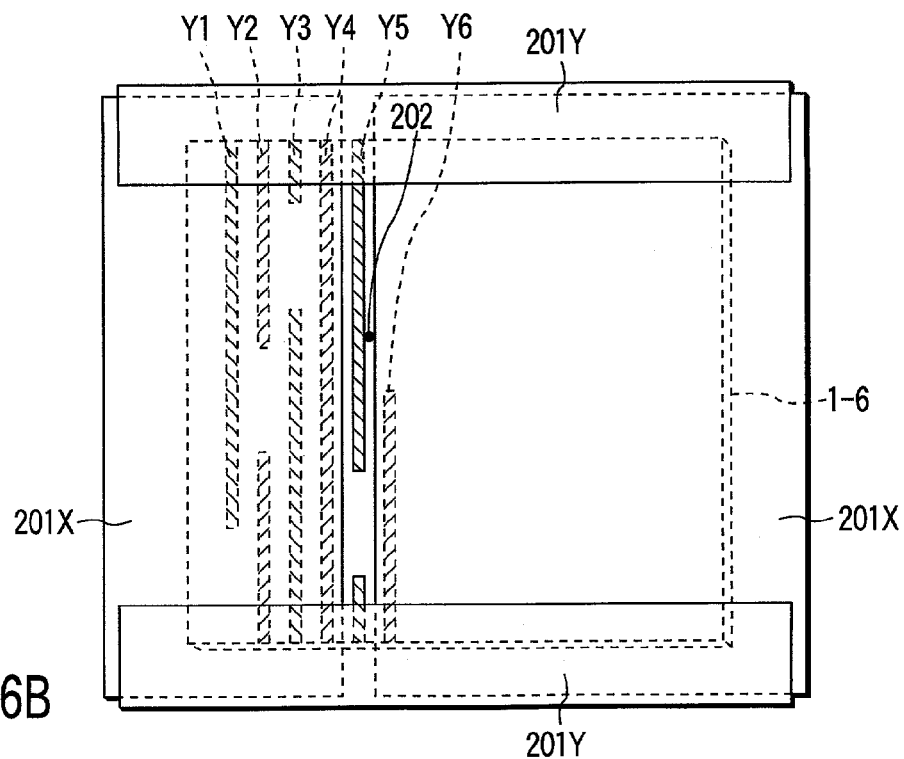
FIG. 6B is a plan view showing a state in which the Y-direction dicing region forming master mask according to the first embodiment of this invention is illuminated.

FIG. 6A shows the state in which the divided chip X5 among the divided chips (only X1 to X6 are shown in FIG. 6A) in the X direction drawn on the master mask 1-5 is selected and illuminated.

As shown in FIG. 6A, the size of a window 202 in the X direction is set to correspond to the exposure field of the master mask 1 in the X direction, for example, by use of an X-blind 201X. Further, the size of the window 202 in the Y direction is set to correspond to an area of the divided chip X5 by use of a Y-blind 201Y.

Thus, if the exposure field is limited by use of the mechanical blind 201, each shot can be selected and exposed even in a case where a plurality of divided chips X1 to X25 are arranged on one master mask 1-5, that is, a plurality of shots are arranged on one master mask 1-5.

FIG. 6B shows the state in which the divided chip Y5 among the divided chips (only Y1 to Y6 are shown in FIG. 6B) in the Y direction drawn on the master mask 1-6 is selected and illuminated.

In this case, for example, the size of the window 202 in the Y direction is set to correspond to the exposure field of the master mask 1 in the Y direction by use of the Y-blind 201Y. Further, the size of the window 202 in the X direction is set to correspond to an area of the divided chip Y5 by use of the X-blind 201X. Thus, only the divided chip Y5 among a plurality of divided chips Y1 to Y24 drawn on one master mask 1-6 can be selected and exposed.

When a plurality of divided chips X or Y are arranged on the master mask 1, the distance therebetween cannot be made smaller than a preset interval. This is because a blur occurs to some extent since the mechanical blind 201 which exposes only a specified region of the master mask 1 is not optically conjugated with the surface of the master mask 1. In the first embodiment, the amount of blur is 0.3 mm. Therefore, in order to prevent the divided chips X or Y from interfering with each other, it is necessary so separate the divided chips X or Y from each other by an amount larger than at least the above amount of blur.

That is, in order to expose only a target divided chip X or Y and in order not to expose the other divided chips, inhibition regions of the above amount of blur are required on both sides of the divided chip. As a result, the interval between the divided chips X or Y in the first embodiment is 0.5 mm (the width of the dicing region 4)+0.3 mm (the width of the inhibition region) =0.8 mm at minimum. Therefore, in the first embodiment, the maximum number of divided chips contained in one master mask 1 is 21 mm/0.8 mm=26. As described before, since the dicing region 4X in the X direction is divided into 25 portions and the dicing region 4Y in the Y direction is divided into 24 portions, each of the dicing region groups can be contained in one master mask.

As a result, it is conventionally necessary to use 30 master masks, but according to the first embodiment, the number of master masks can be suppressed to six in total including four master masks used for the functional elements A and two master masks used for the dicing regions in the X and Y directions. By thus reducing the number of master masks 1, the cost for forming the reticle can be lowered.

SECOND EMBODIMENT

In a second embodiment, the number of master masks is further suppressed in comparison with a case of the first embodiment.

In order to further suppress the number of master masks, the following measure is taken in the second embodiment.

As is explained in the first embodiment, in order to form a pattern of a functional element A which is an original object to manufacture, four master masks 1-1 to 1-4 are required.

Figure 7A:
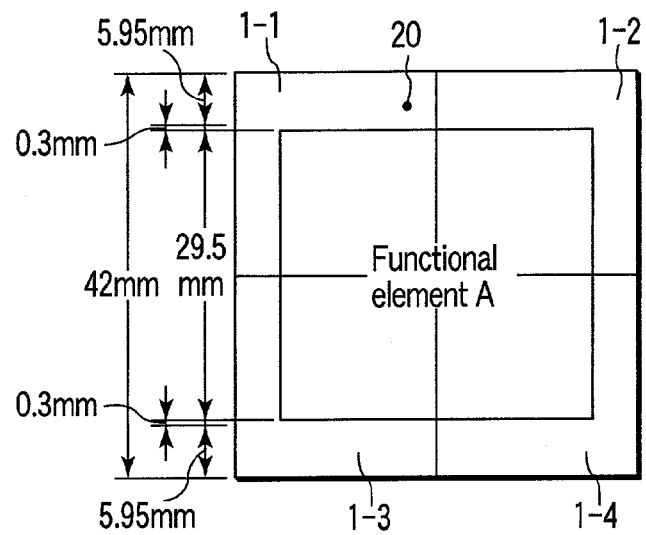
FIG. 7A is a plan view showing an enlarged portion of the functional element forming master masks according to the first embodiment.

FIG. 7A is a plan view showing an enlarged portion of the master masks 1-1 to 1-4 shown in FIG. 3. As shown in FIG. 7A, when an area configured by the four master masks 1-1 to 1-4 is compared with an area of the functional element A, the area configured by the four master masks 1-1 to 1-4 is larger and a marginal portion 20 is left on the front, rear, right and left portions of the functional element A. In the first embodiment, the marginal portion 20 is not used. In the second embodiment, the number of master masks is suppressed by arranging a pattern other than the functional element A, for example, a pattern of a dicing region 4 in the marginal portion.

Figure 8A:
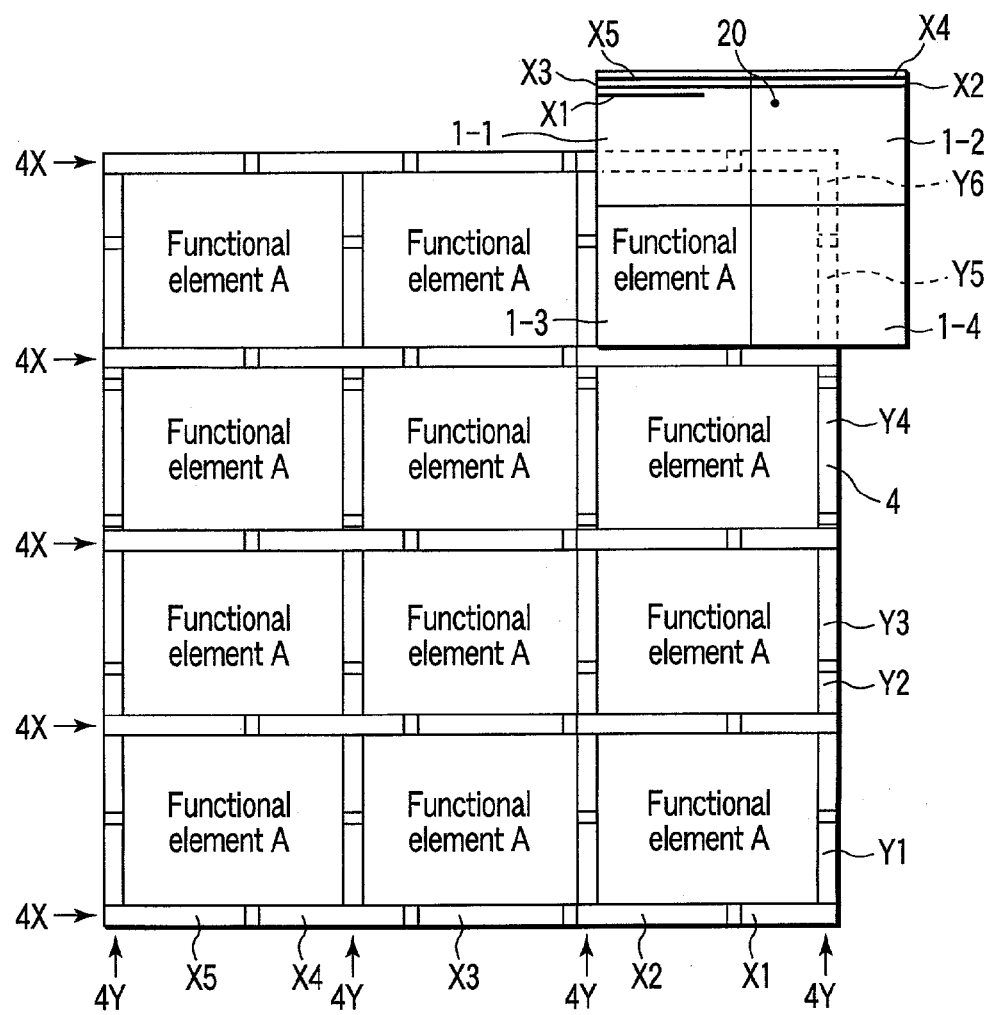
FIG. 8A is a plan view showing the functional element and X-direction dicing region forming master masks according to the second embodiment of this invention.
Figure 8B:
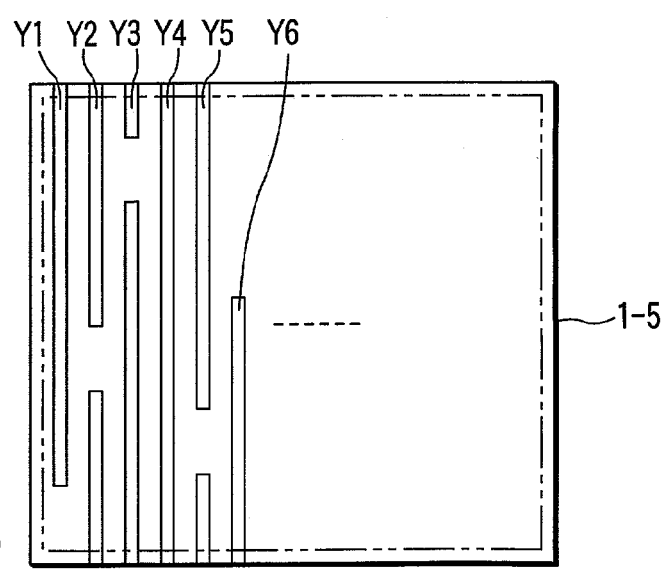
FIG. 8B is a plan view showing the Y-direction dicing region forming master mask according to the second embodiment of this invention.

FIGS. 8A and 8B are plan views showing the master masks according to the second embodiment. Particularly, as shown in FIG. 8A, in the second embodiment, divided chips X (only X1 to X5 are shown in FIG. 8A) in the X direction are arranged in the marginal portion 20.

Further, in the second embodiment, in order to effectively use the marginal portion 20, the functional element A is not arranged in the central portion of the area configured by the master masks 1-1 to 1-4 and is arranged in a portion shifted from the center of the area, for example, arranged in contact with the corner portion of the area. In FIG. 8A, particularly, a case wherein the functional element A is arranged in contact with the lower left corner of the area is shown. Thus, if the functional element A is arranged in contact with the lower left corner, a larger marginal portion 20 can be provided on the right side and upper side of the functional element A. The divided chips X in the X direction are arranged in the larger marginal portion.

Figure 7B:
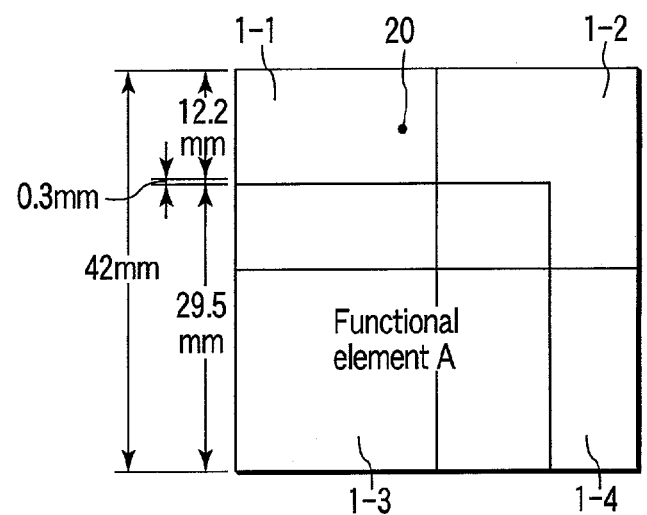
FIG. 7B is a plan view showing an enlarged portion of functional element and X-direction dicing region forming master masks according to a second embodiment of this invention.

A plan view showing an enlarged portion of the master masks 1-1 to 1-4 shown in FIG. 8A is shown in FIG. 7B. As shown in FIG. 7B, an effective marginal portion 20 which has a size of 42 mm×12.2 mm and on which another pattern can be arranged is provided on the master masks 1-1 to 1-4 on which the functional element A is drawn. The area of the marginal portion 20 is larger than the area of 21 mm×21 mm of one master mask. Therefore, the divided chips X of the dicing region 4X in the X direction can be arranged in the marginal portion 20. As shown in FIG. 8B, like the first embodiment, the divided chips Y of the dicing region 4Y in the Y direction are arranged on the master mask 1-6.

Thus, according to the second embodiment, it is possible to reduce the number of master masks required for forming a reticle from six in the case of the first embodiment to five.

THIRD EMBODIMENT

In a third embodiment, the number of master masks is further suppressed in comparison with a case of the first and second embodiments.

In the first and second embodiments, a general case where the pattern of the dicing region 4 does not have any repetitiveness at all and all of the divided chips X, Y of the dicing region 4 are required to be arranged is explained.

However, in practice, some of the patterns of the dicing regions 4 contained in a reticle used to expose an electronic device have some repetitiveness. If even one pattern which has the repetitiveness and is contained in the patterns of the dicing region 4 is provided on the master mask 1, the repetitive exposing/transferring process can be performed. As the number of repeated patterns on the reticle is larger, the number of patterns which are required to be drawn on the master mask becomes smaller and the number of required master masks decreases.

For example, in the pattern shown in FIG. 3, the dicing region 4X in the X direction is arranged on five lines. A common pattern is used for the dicing region 4X on the internal three lines among the five lines in some cases. At this time, the required patterns of the dicing region 4X on the master mask 1 are three types of patterns of upper end portion, lower end portion and internal portion.

Likewise, a common pattern is used for the internal two lines of the dicing region 4Y in the Y direction arranged on the four lines in some cases. Therefore, the required patterns of the dicing region 4Y on the master mask 1 are three types of patterns of upper end portion, lower end portion and internal portion.

Thus, if the patterns of the dicing region 4 are common, a region required for the dicing region 4 can be reduced to a large extent on the master mask 1. Further, when a region required for the dicing region 4 is small and a large amount of marginal portion is left behind on the master mask 1 of the functional element A, all of the patterns of the dicing region 4 can be arranged on the master mask 1 of the functional element A. This is shown in FIG. 9.

Figure 9:
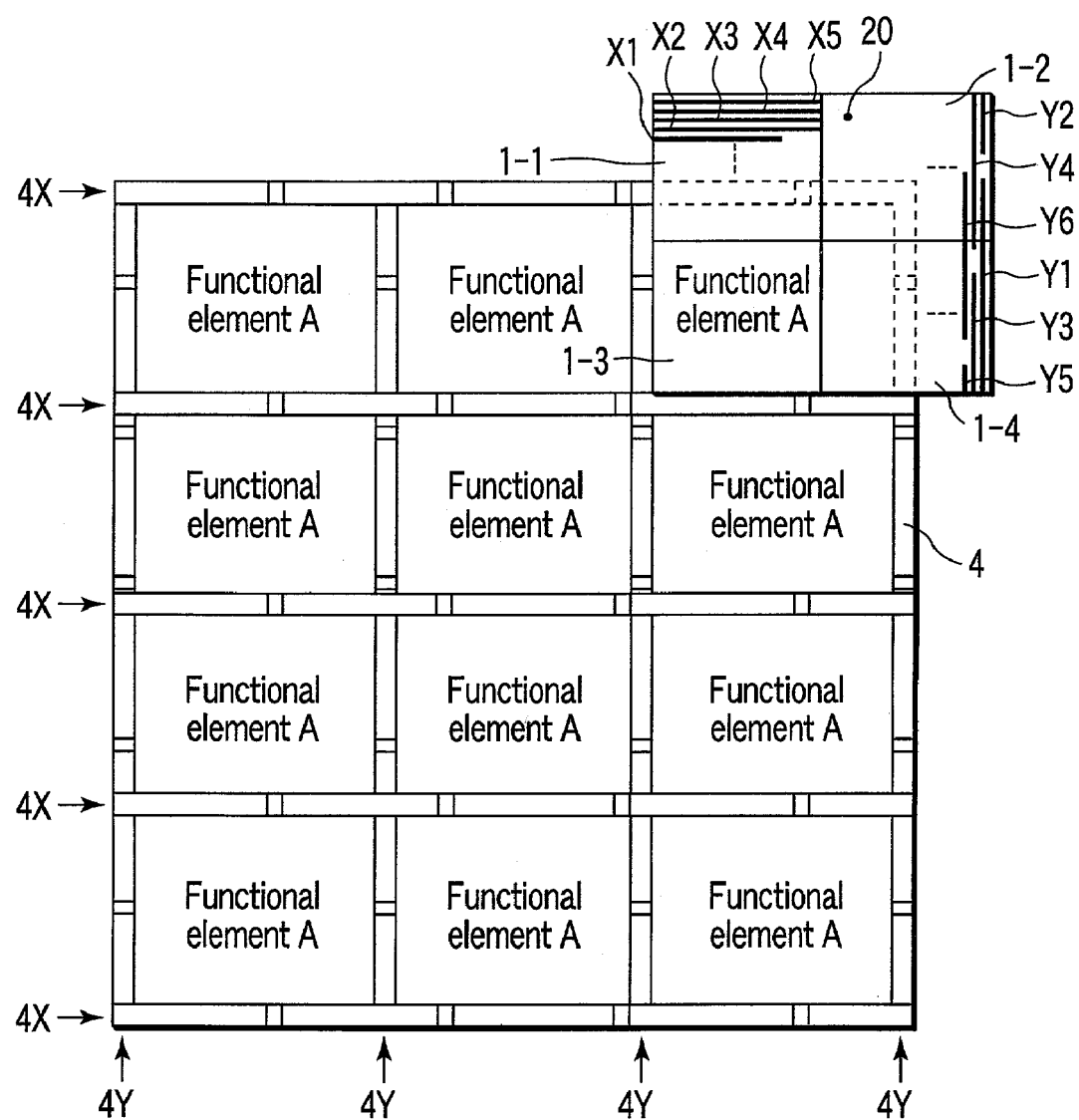
FIG. 9 is a plan view showing the functional element and X-direction and Y-direction dicing region forming master masks according to the third embodiment of this invention.

FIG. 9 is a plan view showing the master mask according to the third embodiment. As shown in FIG. 9, the dicing region 4X of one line in the X direction is divided into five divided chips X, for example. As described before, since three types of patterns of the dicing region 4X are provided, 15 regions in total are necessary. In order to arrange the 15 divided chips X on one master mask 1, a region of 12 mm×21 mm is required if the arrangement interval is set at 0.8 mm like the case of the first embodiment.

Figure 7C:
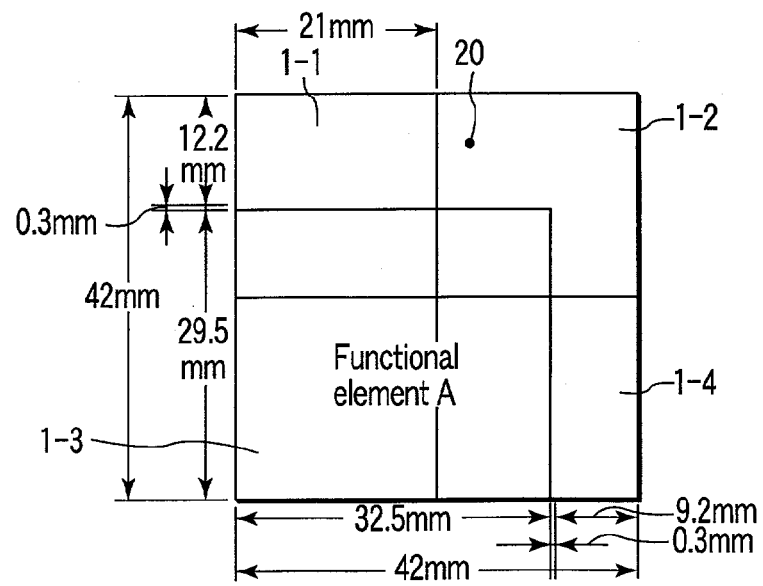
FIG. 7C is a plan view showing an enlarged portion of functional element and X-direction and Y-direction dicing region forming master masks according to a third embodiment of this invention.

The plan view of an enlarged portion of the master masks 1-1 to 1-4 shown in FIG. 9 is shown in FIG. 7C. As shown in FIG. 7C, since a marginal portion 20 with the height of 12.2 mm is left on the upper side of the functional element A, all of the 15 divided chips X can be arranged on one master mask 1-1, for example.

Further, the dicing region 4Y of one line in the Y direction is divided into six divided chips Y, for example. Since three types of patterns of the dicing region 4Y are provided, 18 regions in total are necessary. The area of a region in which the 18 regions are arranged is 14.4 mm×21 mm based on the same calculation. As shown in FIG. 7C, if a region extending over the two master masks 1-2 and 1-4 in the Y direction is used, the region can be made to have an area of 7.2 mm×42 mm. Since the area of the marginal portion 20 on which the divided chips can be arranged in the Y direction is 9.2 mm×42 mm except the arrangement inhibition region, all of the 18 divided chips Y can be arranged on the two master masks 1-2 and 1-4, for example.

Thus, according to the third embodiment, the number of masks required for forming a reticle can be reduced from six in the first embodiment and five in the second embodiment to four.

FOURTH EMBODIMENT

The above first to third embodiments are made by considering how to reduce the number of masks required when a new reticle is formed.

The fourth embodiment is made by paying attention to how to reduce the number of masks whose patterns are changed when the pattern of the existing reticle is improved.

Figure 10A:
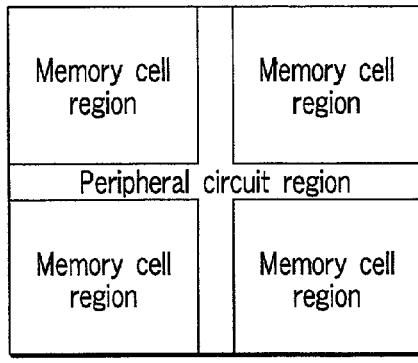
FIGS. 10A and 10B are plan views respectively showing patterns of semiconductor storage device chips.

Generally, when an electric device, for example, semiconductor device is manufactured, the pattern of a reticle is improved in many cases in order to improve the electrical characteristic and enhance the yield thereof. In a semiconductor storage device such as a DRAM or flash memory, the pattern of the chip can be roughly divided into two types. The two patterns include a memory cell region (cell array pattern) which performs storage of information and a peripheral circuit region on which a circuit and the like used to output an electrical signal read out from the memory cell region to the exterior are arranged. As shown in FIG. 10A, the positions of the memory cell region and peripheral circuit region on the chip are roughly determined. In most of the semiconductor storage devices, the peripheral circuit region is arranged in substantially the central portion of the chip in order to synchronize the timings of electrical signals. A portion of the pattern of a reticle corresponding to the peripheral circuit region is most frequently improved.

Figure 10B:
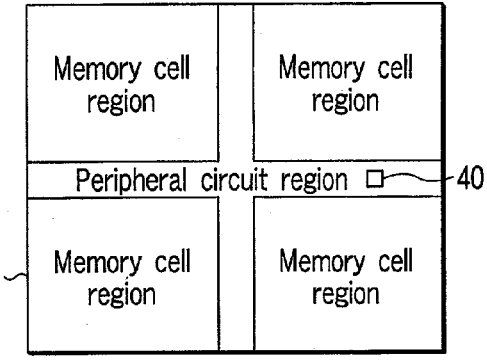

When the pattern of the memory cell region is improved, it is necessary to newly reform the master masks since the memory cell region is arranged on all of the master masks. However, as shown in FIG. 10B, for example, when a local portion of the peripheral circuit region is improved, it is only necessary to replace the master mask containing an improved portion 40.

Therefore, in the fourth embodiment, in order to effectively cope with the improvement of the peripheral circuit region, the peripheral circuit region is arranged to extend over the smallest possible number of master masks.

As described in the first embodiment, an area configured by the master masks 1-1 to 1-4 used for the functional element (semiconductor storage device in this example) is always larger than the functional element. Therefore, a relatively high degree of freedom can be provided when the functional element is arranged in the area configured by the master masks 1-1 to 1-4.

Figure 11:
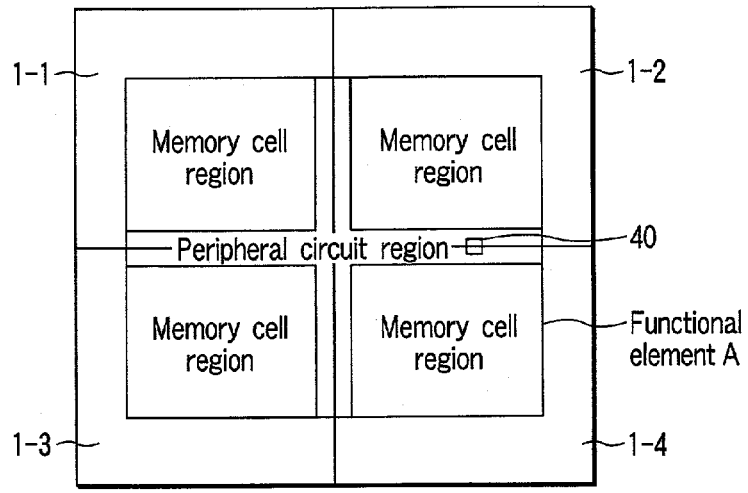
FIG. 11 is a plan view showing the arrangement of typical master masks.

For example, as shown in FIG. 11, if the functional element is arranged in the central portion of the area configured by the master masks 1-1 to 1-4, the improved portion 40 is arranged to extend over the two master masks, for example, the master masks 1-2 and 1-4 as shown in FIG. 11, and in this case, the two master masks are required to be newly reformed.

Figure 12:
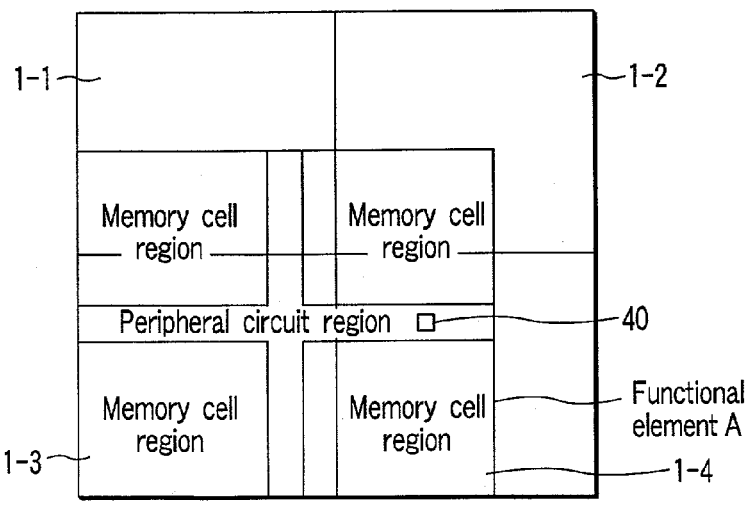
FIG. 12 is a plan view showing the arrangement of master masks according to a fourth embodiment of this invention.

In order to avoid this, in the fourth embodiment, as shown in FIG. 12, the corner portion of the functional element is set to correspond to the corner potion of area configured by the master masks 1-1 to 1-4. As a result, the improved portion 40 can be arranged only on one master mask, for example, on the master mask 1-4 as shown in FIG. 12. Therefore, the number of master masks to be newly reformed becomes one.

With the above arrangement, the number of master masks to be replaced when the pattern of the peripheral circuit region is improved can be reduced.

Further, since the above arrangement method is not inconsistent with a method used to enlarge the marginal portion 20 of the master masks for the functional element described in the second and third embodiments, a more effective result can be obtained if the fourth embodiment is combined with the second or third embodiment.

FIFTH EMBODIMENT

A case wherein the improved portion 40 belong to part of the peripheral circuit region is explained in the fourth embodiment.

The fifth embodiment relates to how to reduce the number of master masks to be newly formed when a plurality of improved portions 40 are provided in different portions.

Figure 13A:
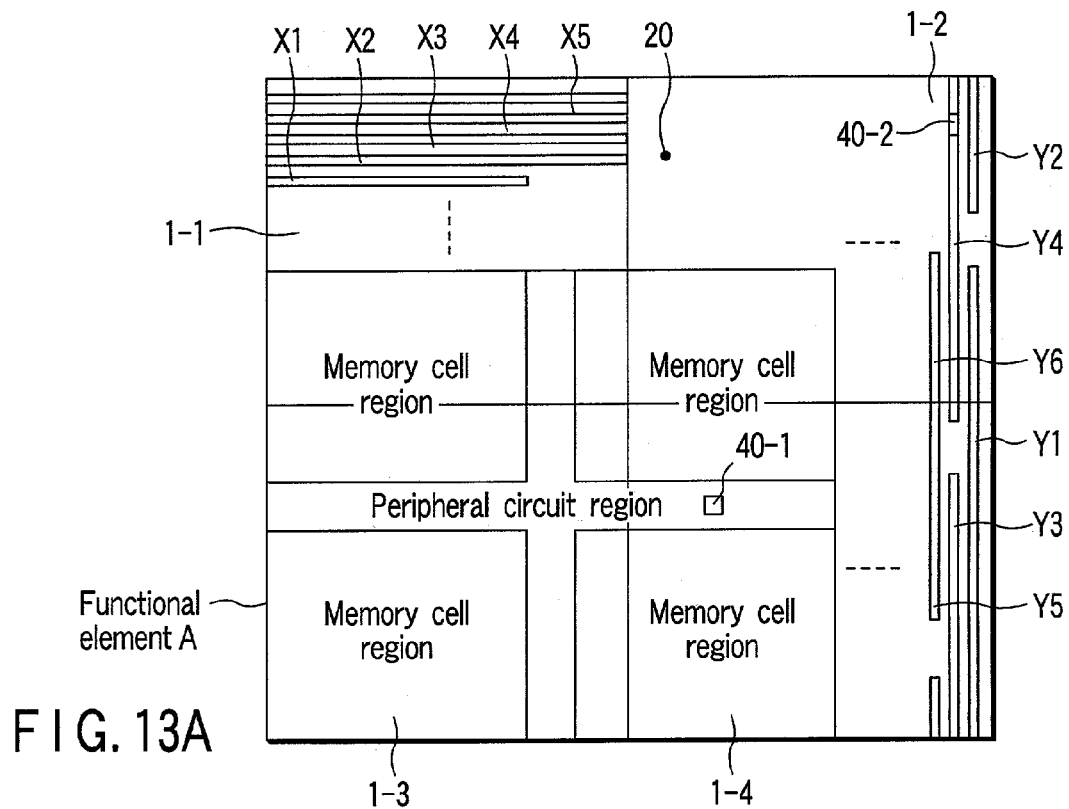
FIG. 13A is a plan view showing an improved portion of the master masks.
Figure 13B:
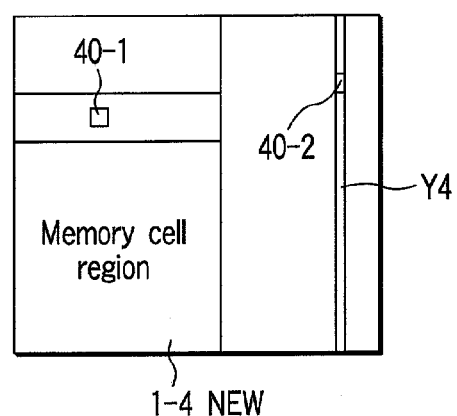
FIG. 13B is a plan view showing a corrected master mask according to a fifth embodiment of this invention.

FIGS. 13A and 13B are plan views for illustrating a master mask correction method according to the fifth embodiment of this invention.

In FIG. 13A, an example in which improved portions 40-1, 40-2 exist in a portion of the peripheral circuit region and in a portion of the dicing region 4Y in the Y direction is shown. The improved portions 40-1, 40-2 exist in different master masks 1-2 and 1-4. Therefore, in order to correct the pattern, it is necessary to newly reform the master masks 1-2 and 1-4.

However, as shown in FIG. 13B, the improved portions 40-1, 40-2 can be contained in one master mask. For example, in the fifth embodiment, the master masks 1-2, 1-4 are used for divided chips Y (Y1 to Y3, Y5, Y6 in this example) which are not improved among the whole divided chips Y and only the divided chip Y (Y4 in this example) which includes the improved portion 40-2 is drawn on a marginal portion 20 of a master mask 1-4NEW which includes the improved portion 40-1 and is newly reformed. Thus, even if the improved portions 40 are provided in different portions, the number of master masks to be reformed can be reduced.

As described in the fifth embodiment, the number of master masks which are required to be corrected when the pattern is improved can be reduced by newly forming a master mask by use of the improved portions.

SIXTH EMBODIMENT

Figure 14:
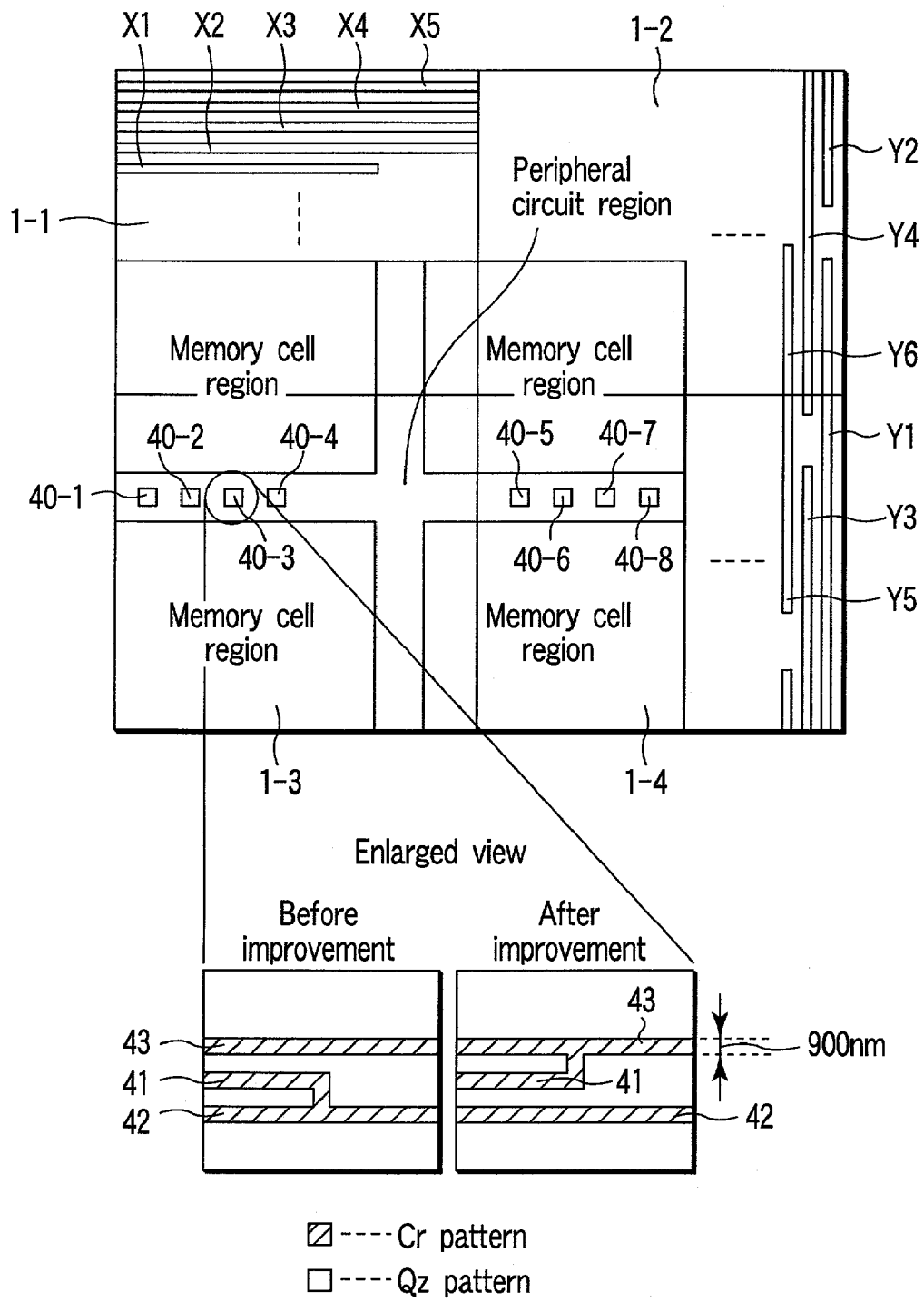
FIG. 14 is a plan view showing corrected master masks according to a sixth embodiment of this invention.

FIG. 14 is a plan view showing a master mask correction method according to a sixth embodiment of this invention.

As shown in FIG. 14, in the sixth embodiment, eight improved portions 40-1 to 40-8 are contained in each functional element. As shown in enlarged portions of FIG. 14, each of the improved portions is so formed that a state in which an interconnection pattern 41 arranged at the center thereof is connected to an interconnection pattern 42 adjacent to and below the interconnection pattern 41 (before improving) will be changed to a state in which the interconnection pattern 41 is connected to an interconnection pattern 43 adjacent to and above the interconnection pattern 41 (after improving). The interconnection patterns 41, 42, 43 are Cr (chrome) patterns with the width of 900 nm.

Since the above eight improved portions 40-1 to 40-8 are arranged over the two master masks 1-3 and 1-4, it is necessary to newly form two master masks.

However, even if the new master mask is not formed, the pattern can be easily improved by correcting the existing master mask. For example, laser repair and focused ion beam (FIB) may be used. One example of correction on the master mask by use of laser repair and FIB is explained below.

First, chrome (Cr) in a portion used to connect the interconnection pattern 41 arranged at the center to the interconnection pattern 42 adjacent to and below the interconnection pattern 41 is removed by use of laser repair. Then, carbon is deposited on the master mask 1 formed of quartz (Qz) to connect the interconnection pattern 41 to the interconnection pattern 43 adjacent to and above the interconnection pattern 41 by use of FIB.

The correction on the master mask 1 is made for all of the improved portions 40-1 to 40-8 on the master masks 1-3, 1-4. If a reticle is formed by use of the thus corrected master masks 1-3, 1-4, a pattern after improving can be obtained on the formed reticle.

The reason why the pattern on the master mask 1 is corrected instead of correcting the pattern on the reticle is based on the following two reasons.

First, the pattern size on the master mask 1 is five times that on the reticle, for example, and it is easier to correct the pattern on the master mask 1 than to correct the pattern on the reticle.

Second, since the eight improved portions 40-1 to 40-8 are provided for each functional element, correction for 8×12=96 portions is necessary if an attempt is made to make correction on a reticle having twelve functional elements of the same type, for example, and a large amount of labor is required and the possibility that all of the corrections are not successfully made becomes stronger.

By using the sixth embodiment, the improvement of the pattern on the reticle can be coped with without newly forming a master mask by correcting the pattern on the master mask 1.

SEVENTH EMBODIMENT

Figure 15A:
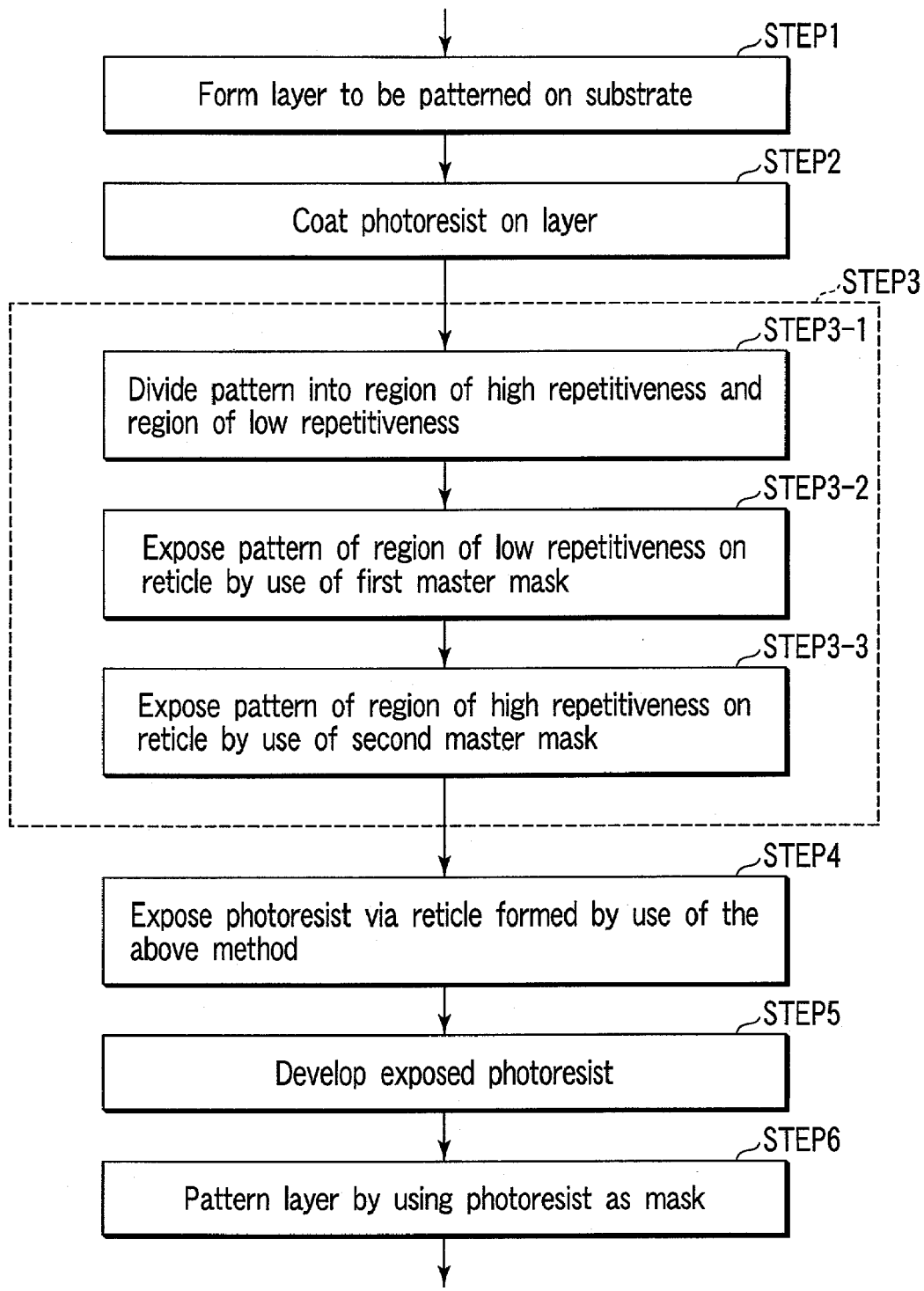
FIG. 15A is a process flowchart for illustrating a semiconductor device manufacturing method according to a seventh embodiment of this invention.

FIG. 15A is a process flowchart showing a semiconductor device manufacturing method using a reticle by use of the exposure method according to one of the first to sixth embodiments, for illustrating a seventh embodiment of this invention.

As shown in FIG. 15A, for example, a layer of a silicon oxide film, silicon nitride film and polysilicon layer which is to be patterned is formed on a substrate (wafer) (STEP1) and a photoresist is coated on the layer (STEP2). Then, prepare a reticle formed by use of the above exposure method (STEP3). The reticle is formed by using master masks on which a pattern having size larger than a region which can be exposed at one time and divided into patterns lying within a range of the region which can be exposed at one time is drawn. The exposure method includes the following three steps. The first step is to divide a pattern of the size larger than a region which can be exposed at one time into a region of high repetitiveness and a region of low repetitiveness (STEP3-1). The second step is to expose the pattern of the region of low repetitiveness on the reticle by use of at least one first master mask on which the pattern of the region of low repetitiveness is drawn (STEP3-2). The third step is to commonly expose the pattern of the region of high repetitiveness on the reticle by use of at least one second master mask on which the pattern of the region of high repetitiveness is drawn (STEP3-3).

Then, the photoresist is exposed via a reticle formed by use of the above method (STEP4).

After this, the photoresist is developed (STEP5) and the layer is patterned with the photoresist used as a mask (STEP6).

As the other basic semiconductor device manufacturing steps, steps which are known in the art may be used, and after various elements are formed, the dicing step, mounting step, packaging step and the like are performed to complete a semiconductor device.

According to the above semiconductor device manufacturing method, a reticle can be formed by use of a small number of master masks, the forming cost thereof can be lowered and the cost of the semiconductor device can be lowered.

Figure 15B:
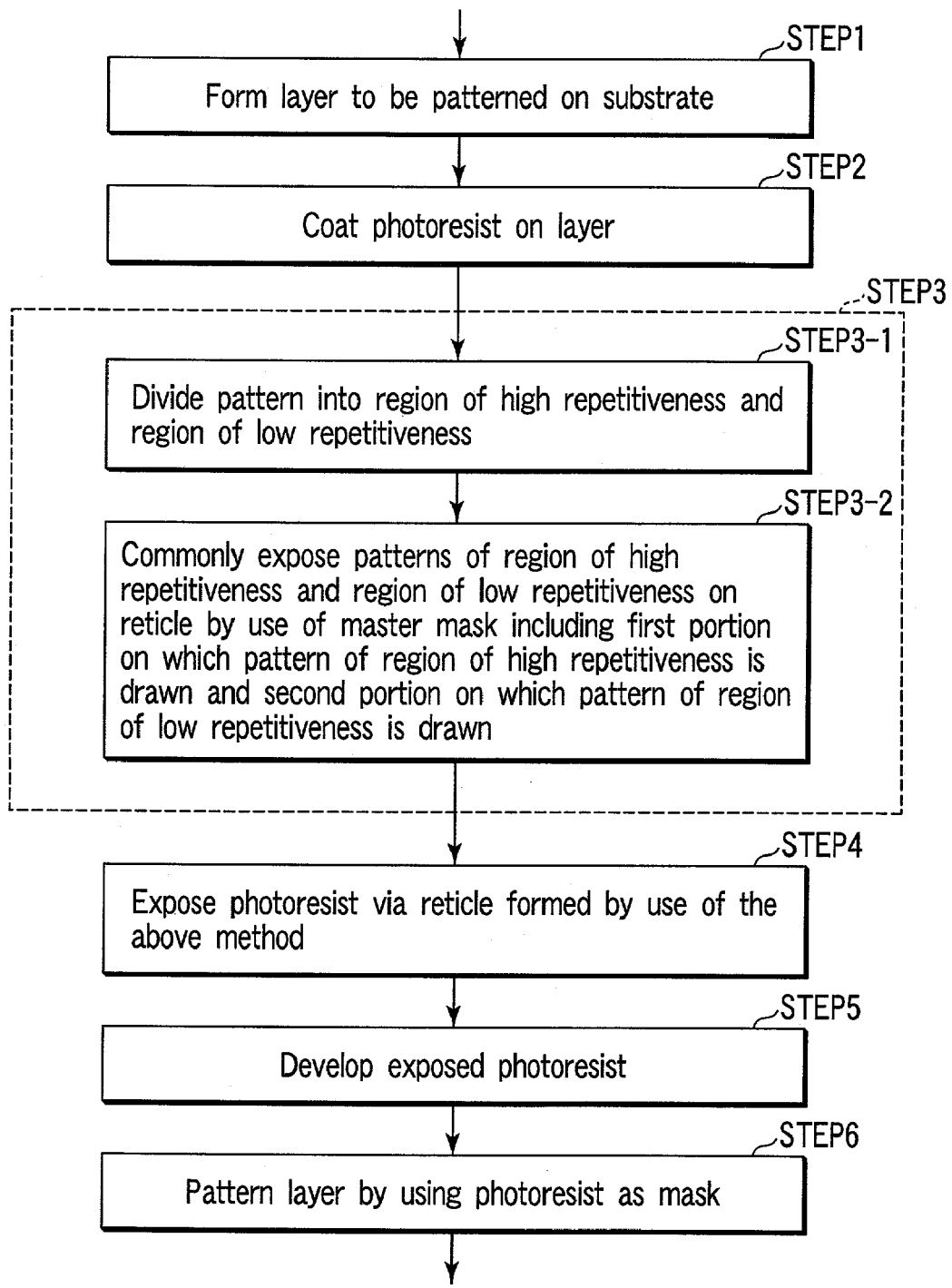
FIG. 15B is a process flowchart for illustrating a modification of the manufacturing method shown in FIG. 15A.

The reticle exposing step (STEP3) can be performed by two steps as shown in FIG. 15B. The first step is to divide a pattern of the size larger than a region which can be exposed at one time into a region of high repetitiveness and a region of low repetitiveness (STEP3-1). The second step is to expose a pattern of the region of low repetitiveness on the reticle by use of a master mask having a portion on which the pattern of the region of high repetitiveness is drawn and a portion which is different from the above portion and on which the pattern of the region of low repetitiveness is drawn and commonly expose the pattern of the region of high repetitiveness on the reticle by use of the above master mask (STEP3-2).

EIGHTH EMBODIMENT

FIG. 16 is a process flowchart showing a semiconductor device manufacturing method using a photoresist patterned by the exposure method according to one of the first to sixth embodiments as a mask, for illustrating an eighth embodiment of this invention.

In the seventh embodiment, the etching mask or the photoresist pattern is formed by use of the reticle, but in the eighth embodiment, a photoresist coated on the wafer is directly exposed using plural master masks.

Figure 16A:
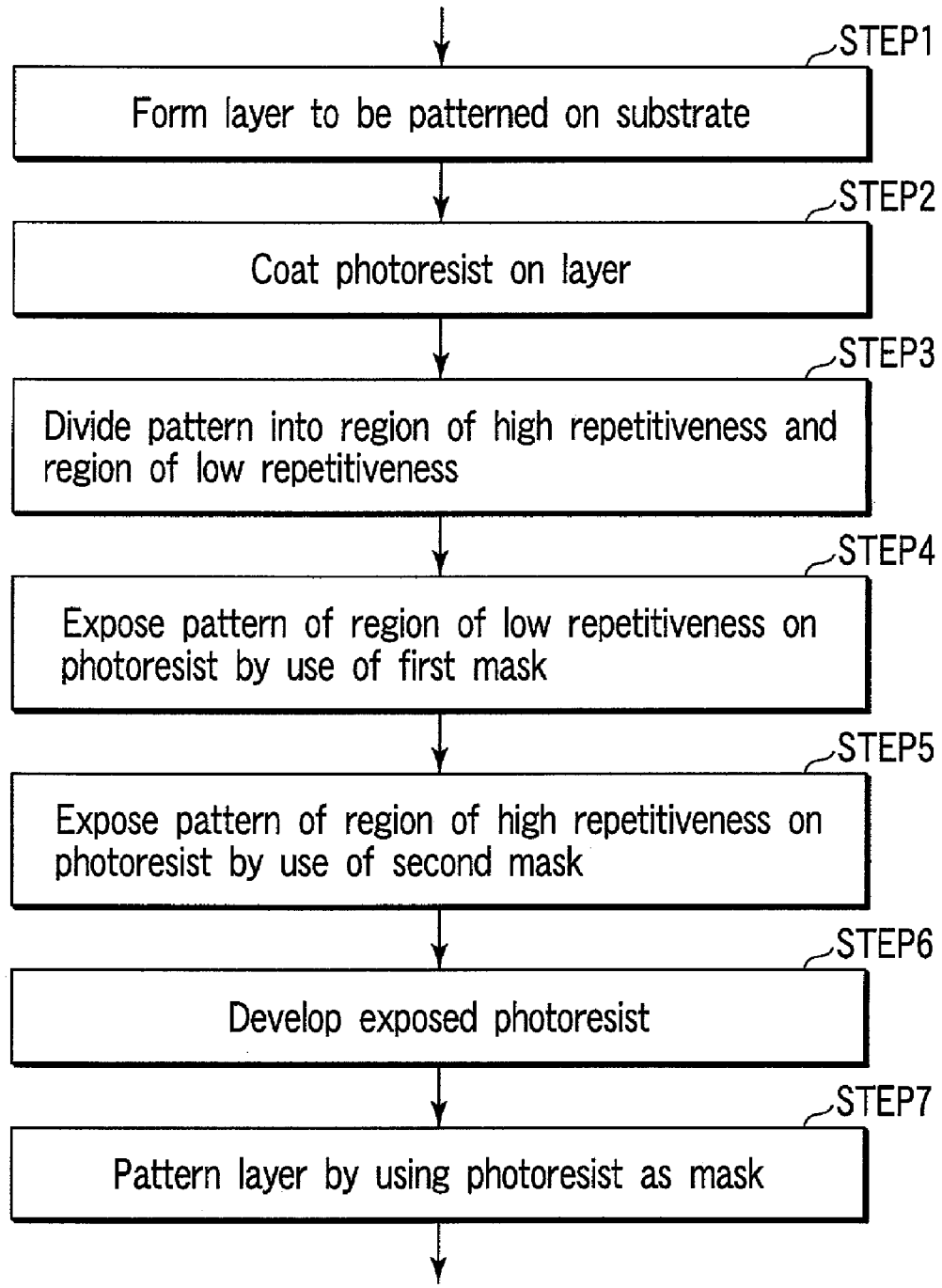
FIG. 16A is a process flowchart for illustrating a semiconductor device manufacturing method according to an eighth embodiment of this invention.

As shown in FIG. 16A, for example, a layer of a silicon oxide film, silicon nitride film and polysilicon layer which is to be patterned is formed on a substrate (wafer) (STEP1) and a photoresist is coated on the layer (STEP2). Then, in order to expose the photoresist, a pattern of size larger than a region which can be exposed at one time is divided into a region of high repetitiveness and a region of low repetitiveness (STEP3). Next, a pattern of the region of low repetitiveness is exposed by use of at least one first master mask on which the pattern of the region of low repetitiveness is drawn (STEP4). After this, a pattern of the region of high repetitiveness is commonly exposed on the photoresist by use of at least one second master mask on which the pattern of the region of high repetitiveness is drawn (STEP5). Then, the photoresist is developed (STEP6) and the above layer is patterned with the photoresist used as a mask (STEP7).

As the other basic semiconductor device manufacturing steps, steps which are known in the art may be used, and after various elements are formed, the dicing step, mounting step, packaging step and the like are performed to complete a semiconductor device.

According to the above semiconductor device manufacturing method, a large size semiconductor device can be exposed by use of an inexpensive small area exposure apparatus, the cost of the semiconductor device can be lowered. Further, it become possible to expose the large size semiconductor device which cannot be exposed conventional technique.

As shown in FIG. 16B, the photoresist exposing step (STEP3, STEP4, STEP5) can be realized by use of a step (STEP3) in which a pattern of size larger than a region which can be exposed at one time is divided into a region of high repetitiveness and a region of low repetitiveness and a step (STEP4) in which a pattern of the region of low repetitiveness is exposed on the photoresist by use of a mask having a portion on which the pattern of the region of high repetitiveness is drawn and a portion which is different from the above portion and on which the pattern of the region of low repetitiveness is drawn and the pattern of the region of high repetitiveness is commonly exposed on the photoresist by use of the above mask.

As described above, according to one aspect of this invention, it is possible to provide a master mask and a forming method thereof which can be used to reduce the manufacturing cost of a product (for example, a reticle) formed by performing a plurality of exposure steps, an exposure method using the master mask, and a semiconductor device manufacturing method using the exposure method.

Further, it is possible to provide a master mask and a forming method thereof which can be used to reduce the correction cost required for correcting a product (for example, a reticle) formed by performing a plurality of exposure steps, an exposure method using the master mask, and a semiconductor device manufacturing method using the exposure method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method which forms master masks used when a pattern of size larger than a region which can be exposed at one time is exposed on a to-be-exposed object, comprising:
    dividing the pattern of the size larger than the region which can be exposed at one time into a dicing region and a functional element,
    drawing a pattern of the dicing region on first master masks, and
    drawing a pattern of the functional element on second master masks.

2. The master mask forming method according to claim 1, the pattern of the dicing region includes patterns in an X direction and patterns in a Y direction which intersects with the X direction, and one of the X-direction patterns and Y-direction patterns is drawn on the first master mask.

3. The master mask forming method according to claim 2, wherein the pattern of the dicing region is divided into a plurality of patterns according to the region which can be exposed at one time and the plurality of divided patterns of the dicing region are drawn on the first master mask.

4. A method which forms master masks used when a pattern of size larger than a region which can be exposed at one time is exposed on a to-be-exposed object, comprising:
    dividing the pattern of the size larger than the region which can be exposed at one time into a dicing region and a functional element,
    drawing a pattern of the functional element on master masks, and
    drawing a pattern of the dicing region on a portion of the master masks other than a portion of the master masks on which the pattern of the functional element is drawn.

5. The master mask forming method according to claim 4, wherein the pattern of the dicing region includes patterns in an X direction and patterns in a Y direction which intersects with the X direction, and at least one of the X-direction patterns and Y-direction patterns is drawn on the master mask.

6. The master mask forming method according to claim 5, wherein the pattern of the dicing region is divided into a plurality of patterns according to the region which can be exposed at one time and the plurality of divided patterns of the dicing region are drawn on the master mask.

7. An exposure method which exposes a pattern of size larger than a region which can be exposed at one time on a to-be-exposed object by using master masks on which the pattern divided into patterns lying within a range of the region which can be exposed at one time is drawn, comprising:
dividing the pattern of the size larger than the region which can be exposed at one time into a functional element and a dicing region,
exposing a pattern of the dicing region on the to-be-exposed object by use of first master masks on which the pattern of the dicing region is drawn, and
commonly exposing a pattern of the functional element on the to-be-exposed object by use of second master masks on which the pattern of the functional element is drawn.

8. The exposure method according to claim 7, wherein the pattern of the dicing region is divided into a plurality of patterns according to the region which can be exposed at one time and drawn on the first master mask, and only a pattern which is desired to be exposed among the plurality of divided patterns is selected and illuminated when the plurality of divided patterns drawn on the first master mask are exposed on the to-be-exposed object.

9. An exposure method which exposes a pattern of size larger than a region which can be exposed at one time on a to-be-exposed object by using master masks on which the pattern divided into patterns lying within a range of the region which can be exposed at one time is drawn, comprising:
dividing the pattern of the size larger than the region which can be exposed at one time into a functional element and a dicing region, and
exposing a pattern of the dicing region on the to-be-exposed object by use of a master mask having a first portion on which a pattern of the functional element is drawn and a second portion on which the pattern of the dicing region is drawn and commonly exposing the pattern of the functional element on the to-be-exposed object by use of the master mask.

10. The exposure method according to claim 9, wherein the pattern of the dicing region is divided into a plurality of patterns according to the region which can be exposed at one time and drawn on the master mask, and only a pattern which is desired to be exposed among the plurality of divided patterns is selected and illuminated when the plurality of divided patterns drawn on the master mask are exposed on the to-be-exposed object.

11. The exposure method according to claim 9, wherein the pattern of the functional element is shielded and only the pattern of the dicing region is selected and illuminated when the pattern of the dicing region drawn on the master mask is exposed on the to-be-exposed object.

12. The exposure method according to claim 11, wherein the pattern of the dicing region is divided into a plurality of patterns according to the region which can be exposed at one time and drawn on the master mask, and only a pattern which is desired to be exposed among the plurality of divided patterns is selected and illuminated when the plurality of divided patterns drawn on the master mask are exposed on the to-be-exposed object.

13. A method which forms master masks by correcting master masks on which one pattern divided into a plurality of portions is drawn, comprising:

drawing a pattern obtained by correcting to-be-corrected portions of the above one pattern on one master mask when the to-be-corrected portions of the above one pattern lie over a plurality of master masks.

14. A device mask comprising:
a plurality of master masks on which patterns of a dicing region divided according to a region which can be exposed at one time are respectively drawn.

15. A master mask comprising:
a first portion on which a pattern of a functional element is drawn, and
a second portion which is different from said first portion having the pattern of the functional element drawn thereon and on which patterns of a dicing region divided according to a region which can be exposed at one time are drawn.

16. The master mask according to claim 15, which further comprises a third portion on which a shield pattern formed by use of a shielding material is drawn and in which the shield pattern is corrected by use of a shielding material different from the above shielding material.

17. A semiconductor device manufacturing method comprising:
forming a layer to be patterned on a substrate,
coating a photo resist on the layer,
exposing the photoresist via a reticle on which a circuit pattern is formed,
developing the photoresist, and
patterning the layer with the photoresist used as a mask,
wherein the reticle is formed by use of master masks on which a pattern having size larger than a region which can be exposed at one time and divided into patterns lying within a range of the region which can be exposed at one time is drawn and said reticle exposure method includes dividing the pattern of the size larger than the region which can be exposed at one time into a functional element and a dicing region, exposing a pattern of the dicing region on the reticle by use of first master masks on which the pattern of the dicing region is drawn, and commonly exposing a pattern of the functional element on the reticle by use of second master masks on which the pattern of the functional element is drawn.

18. The semiconductor device manufacturing method according to claim 17, wherein the pattern of the dicing region is divided into a plurality of patterns according to the region which can be exposed at one time and drawn on the first master mask, and only a pattern which is desired to be exposed among the plurality of divided patterns is selected and illuminated when the plurality of divided patterns drawn on the first master mask are exposed on the reticle.

19. A semiconductor device manufacturing method comprising:
forming a layer to be patterned on a substrate,
coating a photoresist on the layer,
exposing the photoresist via a reticle on which a circuit pattern is formed,
developing the photoresist, and
patterning the layer with the photoresist used as a mask,
wherein the reticle is formed by use of master masks on which a pattern having size larger than a region which can be exposed at one time and divided into patterns lying within a range of the region which can be exposed at one time is drawn and said reticle exposure method includes dividing the pattern of the size larger than the region which can be exposed at one time into a functional element and a dicing region, and exposing a pattern of the dicing region on the reticle by use of a master mask including a first portion on which the pattern of the functional element is drawn and a second portion on which the pattern of the dicing region is drawn and commonly exposing the pattern of the functional element on the reticle by use of the master mask.

20. The semiconductor device manufacturing method according to claim 19, wherein the pattern of the dicing region is divided into a plurality of patterns according to the region which can be exposed at one time and drawn on the master mask, and only a pattern which is desired to be exposed among the plurality of divided patterns is selected and illuminated when the plurality of divided patterns drawn on the master mask are exposed on the reticle.

21. The semiconductor device manufacturing method according to claim 19, wherein the pattern of the functional element is shielded and only the pattern of the dicing region is selected and illuminated when the pattern of the dicing region drawn on the master mask is exposed on the reticle.

22. The semiconductor device manufacturing method according to claim 21, wherein the pattern of the dicing region is divided into a plurality of patterns according to the region which can be exposed at one time and drawn on the master mask, and only a pattern which is desired to be exposed among the plurality of divided patterns is selected and illuminated when the plurality of divided patterns drawn on the master mask are exposed on the reticle.

23. A semiconductor device manufacturing method comprising:
    forming a layer to be patterned on a substrate,
    coating a photoresist on the layer,
    dividing a pattern of size larger than a region which can be used to expose the photoresist at one time into a functional element and a dicing region,
    exposing a pattern of the dicing region on the photoresist by use of first masks on which the pattern of the dicing region is drawn,
    commonly exposing a pattern of the functional element on the photoresist by use of second masks on which the pattern of the functional element is drawn,
    developing the photoresist, and
    patterning the layer with the photoresist used as a mask.

24. The semiconductor device manufacturing method according to claim 23, wherein the pattern of the dicing region is divided into a plurality of patterns according to the region which can be exposed at one time and drawn on the first mask, and only a pattern which is desired to be exposed among the plurality of divided patterns is selected and illuminated when the plurality of divided patterns drawn on the first mask are exposed on the photoresist.

25. A semiconductor device manufacturing method comprising:
    forming a layer to be patterned on a substrate,
    coating a photoresist on the layer,
    dividing a pattern of size larger than a region which can be used to expose the photoresist at one time into a functional element and a dicing region,
    exposing a pattern of the dicing region on the photoresist by use of a mask including a first portion on which a pattern of the functional element is drawn and a second portion on which the pattern of the dicing region is drawn and commonly exposing the pattern of the functional element on the photoresist by use of the mask,
    developing the photoresist, and
    patterning the layer with the photoresist used as a mask.

26. The semiconductor device manufacturing method according to claim 25, wherein the pattern of the dicing region is divided into a plurality of patterns according to the region which can be exposed at one time and drawn on the mask, and only a pattern which is desired to be exposed among the plurality of divided patterns is selected and illuminated when the plurality of divided patterns drawn on the mask are exposed on the photoresist.

27. The semiconductor device manufacturing method according to claim 25, wherein the pattern of the functional element is shielded and only the pattern of the dicing region is selected and illuminated when the pattern of the dicing region drawn on the mask is exposed on the photoresist.

28. The semiconductor device manufacturing method according to claim 26, wherein the pattern of the dicing region is divided into a plurality of patterns according to the region which can be exposed at one time and drawn on the mask, and only a pattern which is desired to be exposed among the plurality of divided patterns is selected and illuminated when the plurality of divided patterns drawn on the mask are exposed on the photoresist.

* * * * *